(12) United States Patent
Jang et al.

(10) Patent No.: US 12,446,245 B2
(45) Date of Patent: Oct. 14, 2025

(54) METHOD FOR MANUFACTURING OXIDE SEMICONDUCTOR THIN FILM TRANSISTOR

(71) Applicant: UNIVERSITY-INDUSTRY COOPERATION GROUP OF KYUNG HEE UNIVERSITY, Yongin-si (KR)

(72) Inventors: Jin Jang, Seoul (KR); Su Hui Lee, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 957 days.

(21) Appl. No.: 17/431,522

(22) PCT Filed: Apr. 16, 2019

(86) PCT No.: PCT/KR2019/004534
§ 371 (c)(1),
(2) Date: Aug. 17, 2021

(87) PCT Pub. No.: WO2020/184777
PCT Pub. Date: Sep. 17, 2020

(65) Prior Publication Data
US 2022/0140114 A1    May 5, 2022

(30) Foreign Application Priority Data
Mar. 14, 2019  (KR) ................. 10-2019-0029421

(51) Int. Cl.
*H10D 30/67* (2025.01)
*H10D 30/01* (2025.01)
*H10D 64/01* (2025.01)

(52) U.S. Cl.
CPC ....... *H10D 30/031* (2025.01); *H10D 30/6713* (2025.01); *H10D 30/6729* (2025.01);
(Continued)

(58) Field of Classification Search
None
See application file for complete search history.

(56) References Cited

U.S. PATENT DOCUMENTS

| 6,472,329 B1* | 10/2002 | Goto ................... H01L 21/3213 |
| | | 438/720 |
| 2013/0221347 A1* | 8/2013 | Isobe ................ H01L 21/02595 |
| | | 257/43 |

(Continued)

FOREIGN PATENT DOCUMENTS

| JP | 2013-012610 A | 1/2013 |
| KR | 10-2014-0025224 A | 3/2014 |

(Continued)

OTHER PUBLICATIONS

WO 2017061669 A1 English Translation (Year: 2017).*
(Continued)

*Primary Examiner* — Britt D Hanley
*Assistant Examiner* — Carnell Hunter, III
(74) *Attorney, Agent, or Firm* — Sughrue Mion, PLLC

(57) ABSTRACT

Disclosed is a method of fabricating an oxide semiconductor thin-film transistor, the method including a step of forming an oxide semiconductor layer including a channel region, a source region, and a drain region on a substrate; a step of forming a gate insulating layer on the channel region; a step of forming a gate electrode on the gate insulating layer; and a step of forming a source electrode and a drain electrode on the source and drain regions, respectively, wherein the step of forming an oxide semiconductor layer includes a step of selectively plasma-treating the source and drain regions of
(Continued)

the oxide semiconductor layer with a fluorine (F)-based gas, and the source and drain regions contain fluorine (F) at a concentration of $2 \times 10^{14}/cm^3$ to $17.5 \times 10^{21}/cm^3$.

9 Claims, 38 Drawing Sheets

(52) U.S. Cl.
CPC ....... *H10D 30/673* (2025.01); *H10D 30/6733* (2025.01); *H10D 30/6755* (2025.01); *H10D 64/01* (2025.01)

(56) References Cited

U.S. PATENT DOCUMENTS

| | | | | |
|---|---|---|---|---|
| 2014/0054579 | A1* | 2/2014 | Kim | H01L 29/78618 |
| | | | | 257/43 |
| 2015/0053970 | A1* | 2/2015 | Lee | H01L 29/7869 |
| | | | | 257/43 |
| 2017/0338248 | A1* | 11/2017 | Park | H01L 29/66969 |
| 2019/0043997 | A1* | 2/2019 | Lee | H01L 29/42384 |
| 2021/0091083 | A1* | 3/2021 | Kato | H10D 30/6734 |

FOREIGN PATENT DOCUMENTS

| | | |
|---|---|---|
| KR | 10-2015-0030033 A | 3/2015 |
| KR | 10-2017-0041433 A | 4/2017 |
| KR | 10-1810575 B1 | 12/2017 |
| KR | 10-2019-0014991 A | 2/2019 |
| WO | WO-2017061669 A1 * | 4/2017 ....... H01L 29/78618 |

OTHER PUBLICATIONS

Jae Gwang Um et al., "Heavily doped n-type a-IGZO by F plasma treatment and its thermal stability up to 600° C", Applied Physics Letters, vol. 112, 162104, 2018.
Korean Office Action for 10-2019-0029421 dated Oct. 19, 2020.
Korean Office Action for 10-2019-0029421 dated Oct. 3, 2020.
International Search Report for PCT/KR2019/004534 dated Dec. 13, 2019.

* cited by examiner

METHOD FOR MANUFACTURING OXIDE SEMICONDUCTOR THIN FILM TRANSISTOR

CROSS-REFERENCE TO RELATED APPLICATION

This application is a National Stage Entry of PCT International Application No. PCT/KR2019/004534, which was filed on Apr. 16, 2019, and claims priority to Korean Patent Application No. 10-2019-0029421, filed on Mar. 14, 2019 in the Korean Intellectual Property Office, the disclosure of which is incorporated herein by reference.

TECHNICAL FIELD

The present invention relates to a method of fabricating an oxide semiconductor thin-film transistor, and more particularly, to a method of fabricating an oxide semiconductor thin-film transistor with improved electrical properties and reliability.

BACKGROUND ART

In general, a thin-film transistor includes a semiconductor layer for providing a channel region, a source region, and a drain region and a gate electrode overlapping the channel region and insulated from the semiconductor layer by a gate insulating layer.

In recent years, research into using an oxide semiconductor as a semiconductor layer included in a thin-film transistor is continuing. In a thin-film transistor, an oxide semiconductor containing zinc oxide (ZnO) as a main component has an amorphous form and is evaluated as a stable material. Various advantages can be obtained by using such an oxide semiconductor. For example, when an oxide semiconductor is used, a thin-film transistor can be manufactured at a low temperature using existing equipment without additional equipment. However, a thin-film transistor including an oxide semiconductor layer has a problem of low reliability because electrical characteristics are easily changed according to a structure and process conditions.

Meanwhile, a thin-film transistor with high reliability is required to be applied to a liquid crystal display (LCD) panel or an active-matrix organic light-emitting diode (AMOLED) display panel. In response to this demand, a dual gate thin-film transistor including two gate electrodes has been developed through partial structural changes. However, in the case of the dual gate thin-film transistor, there are limitations in increasing electrical properties and reliability due to parasitic voltages or high resistance characteristics generated according to the structures of two gate electrodes and source/drain electrodes.

RELATED ART DOCUMENTS

Patent Documents

Japanese Patent Application Publication No. 2013-012610, "THIN-FILM TRANSISTOR AND METHOD OF FABRICATING THE SAME"

DISCLOSURE

Technical Problem

Therefore, the present invention has been made in view of the above problems, and it is one object of the present invention to provide a method of fabricating an oxide semiconductor thin-film transistor and an oxide semiconductor thin-film transistor fabricated using the method. According to the present invention, an oxide semiconductor thin-film transistor having improved electrical properties, temperature stability, and reliability may be fabricated by plasma-treating a source region and a drain region or first and second offset regions of an oxide semiconductor layer with a fluorine-based gas to convert the source and drain regions or the first and second offset regions having semiconductor characteristics into the source and drain regions or the first and second offset regions having metallic characteristics.

It is another object of the present invention to provide a method of fabricating a dual gate thin-film transistor and a dual gate thin-film transistor fabricated using the method. According to the present invention, a dual gate thin-film transistor having improved electrical properties, temperature stability, and reliability may be fabricated by plasma-treating a source region and a drain region or first and second offset regions of an oxide semiconductor layer with a fluorine-based gas to convert the source and drain regions or the first and second offset regions having semiconductor characteristics into the source and drain regions or the first and second offset regions having metallic characteristics.

Technical Solution

In accordance with one aspect of the present invention, provided is a method of fabricating an oxide semiconductor thin-film transistor, the method including a step of forming an oxide semiconductor layer including a channel region, a source region, and a drain region on a substrate; a step of forming a gate insulating layer on the channel region; a step of forming a gate electrode on the gate insulating layer; and a step of forming a source electrode and a drain electrode on the source and drain regions, respectively, wherein the step of forming an oxide semiconductor layer includes a step of selectively plasma-treating the source and drain regions of the oxide semiconductor layer with a fluorine (F)-based gas, and the source and drain regions contain fluorine (F) at a concentration of $2 \times 10^{14}/cm^3$ to $17.5 \times 10^{21}/cm^3$.

The fluorine-based gas may diffuse on surfaces of the source and drain regions by plasma treatment.

When viewed in a direction perpendicular to the substrate, the oxide semiconductor layer may include a first offset region and a second offset region formed between the gate electrode and the source electrode and between the gate electrode and the drain electrode, respectively.

The fluorine-based gas may include at least one of carbon tetrafluoride ($CF_4$), nitrogen trifluoride ($NF_3$), and sulfur hexafluoride ($SF_6$).

The plasma treatment may be performed at a temperature of 20° C. to 420° C.

The step of selectively plasma-treating the source and drain regions of the oxide semiconductor layer with a fluorine (F)-based gas may include a first plasma treatment step of selectively plasma-treating the source and drain regions of the oxide semiconductor layer with a fluorine (F)-based gas; and a second plasma treatment step of performing plasma treatment to decompose the fluorine-based gas in the first and second offset regions.

The first and second offset regions may each have a width of 0.5 μm or more.

The fluorine may diffuse to a depth of 5 nm to 20 nm from surfaces of the source and drain regions of the oxide semiconductor layer.

The source and drain regions plasma-treated with the fluorine (F)-based gas may have a resistivity of $1\times10^2$ Ω·cm to $3\times10^{-3}$ Ω·cm.

In accordance with another aspect of the present invention, provided is a method of fabricating a dual gate thin-film transistor, the method including a step of forming a first gate electrode on a substrate; a step of forming a first gate insulating layer on the first gate electrode; a step of forming an oxide semiconductor layer including a channel region, a source region, and a drain region on the first gate insulating layer; a step of forming a second gate insulating layer on the channel region; a step of forming a second gate electrode on the second gate insulating layer; and a step of forming a source electrode and a drain electrode on the source and drain regions, respectively, wherein the step of forming an oxide semiconductor layer includes a step of selectively plasma-treating the source and drain regions of the oxide semiconductor layer with a fluorine (F)-based gas, and the source and drain regions contain fluorine (F) at a concentration of $2\times10^{14}/cm^3$ to $17.5\times10^{21}/cm^3$.

When viewed in a direction perpendicular to the substrate, the oxide semiconductor layer may include a first offset region and a second offset region formed between the second gate electrode and the source electrode and between the second gate electrode and the drain electrode, respectively.

The step of selectively plasma-treating the source and drain regions of the oxide semiconductor layer with a fluorine (F)-based gas may include a first plasma treatment step of selectively plasma-treating the source and drain regions of the oxide semiconductor layer with a fluorine (F)-based gas; and a second plasma treatment step of performing plasma treatment to decompose the fluorine-based gas in the first and second offset regions.

The source and drain regions plasma-treated with the fluorine (F)-based gas may have a resistivity of $1\times10^2$ Ω·cm to $3\times10^{-3}$ Ω·cm.

Advantageous Effects

According to embodiments of the present invention, the electrical properties, temperature stability, and reliability of an oxide semiconductor thin-film transistor can be improved by plasma-treating a source region and a drain region or first and second offset regions of an oxide semiconductor layer with a fluorine-based gas to convert the source and drain regions or the first and second offset regions having semiconductor characteristics into the source and drain regions or the first and second offset regions having metallic characteristics.

According to embodiments of the present invention, the electrical properties and reliability of a dual gate thin-film transistor can be improved by plasma-treating a source region and a drain region or first and second offset regions of an oxide semiconductor layer with a fluorine-based gas to convert the source and drain regions or the first and second offset regions having semiconductor characteristics into the source and drain regions or the first and second offset regions having metallic characteristics.

BEST MODE

Figure 1A:
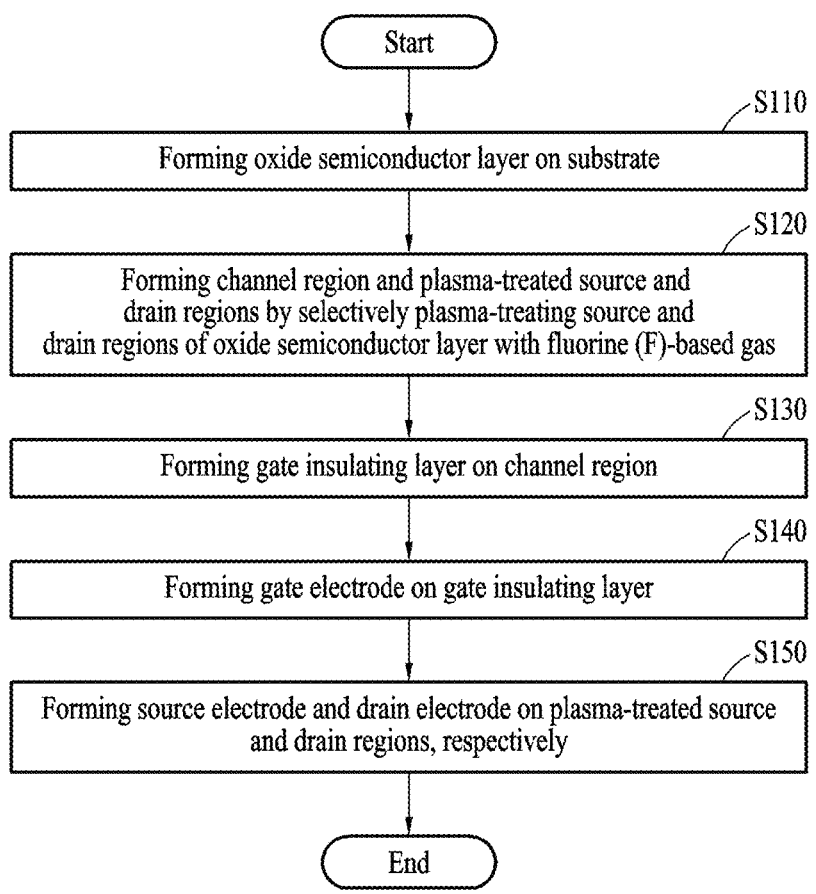
FIG. 1A is a flowchart for explaining a method of fabricating an oxide semiconductor thin-film transistor according to an embodiment of the present invention.

Hereinafter, preferred embodiments of the present invention will be described in detail with reference to the accompanying drawings. However, the scope of the present invention is not limited by these embodiments. Like reference numerals in the drawings denote like elements.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

FIG. 1A is a flowchart for explaining a method of fabricating an oxide semiconductor thin-film transistor according to an embodiment of the present invention.

The method of fabricating an oxide semiconductor thin-film transistor according to an embodiment of the present invention includes step S110 of forming an oxide semiconductor layer including a channel region, a source region, and a drain region on a substrate.

The substrate is a base substrate used in the art for forming an oxide semiconductor thin-film transistor, and materials for forming the substrate are not particularly limited. For example, various materials such as silicon, glass, plastic, quartz, and metal foil may be used.

According to an embodiment, the substrate may be a flexible substrate, and may include at least one of polyester, polyvinyl, polycarbonate, polyethylene, polyacetate, polyimide, polyethersulfone (PES), polyacrylate (PAR), polyethylene naphthalate (PEN), and polyethylene terephthalate (PET).

When a display device having the oxide semiconductor thin-film transistor is implemented as a transparent flexible display device, the substrate may be formed of a transparent flexible material.

The substrate may have a depth of 1 μm to 30 μm, preferably 1 μm to 10 μm.

According to an embodiment, the method of fabricating an oxide semiconductor thin-film transistor according to an embodiment of the present invention may further include a step of forming a buffer layer on the substrate.

The buffer layer may prevent penetration of external impurities such as moisture or oxygen through the substrate, and may planarize the surface of the substrate. However, the buffer layer is not an essential configuration, and may be adopted or omitted depending on the type of the substrate 103.

The buffer layer may be formed by spin coating using a solution for forming a buffer layer. Spin coating is performed by dropping a certain amount of a solution for forming a buffer layer on a substrate and rotating the substrate at a high speed to apply centrifugal force to the solution. When spin coating is used, compared to a deposition process, production cost may be reduced, and process cost and process time may be reduced through simplification of process technology.

In addition, when the buffer layer is used, the buffer layer may include at least one of inorganic materials such as silicon oxide ($SiO_x$), silicon nitride ($SiN_x$), and aluminum oxide ($AlO_x$) and organic materials such as acrylic and polyimide.

The oxide semiconductor layer may include a channel region, a source region, and a drain region, and may be formed by depositing an oxide conductor layer on a substrate, forming a photoresist pattern on the oxide conductor layer, and then selectively etching, i.e., patterning, the oxide conductor layer using the photoresist pattern using a mask.

The oxide semiconductor layer may be formed by a deposition process such as chemical vapor deposition, physical vapor deposition, and atomic layer deposition.

The oxide semiconductor layer may include any one of amorphous indium gallium zinc oxide (a-IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc tin oxide (AZTO).

The method of fabricating an oxide semiconductor thin-film transistor according to an embodiment of the present invention includes step S120 of selectively plasma-treating the source and drain regions of the oxide semiconductor layer with a fluorine (F)-based gas.

Step S120 of selectively plasma-treating the source and drain regions of the oxide semiconductor layer with the fluorine (F)-based gas will be described with reference to FIG. 1B.

Figure 1B:
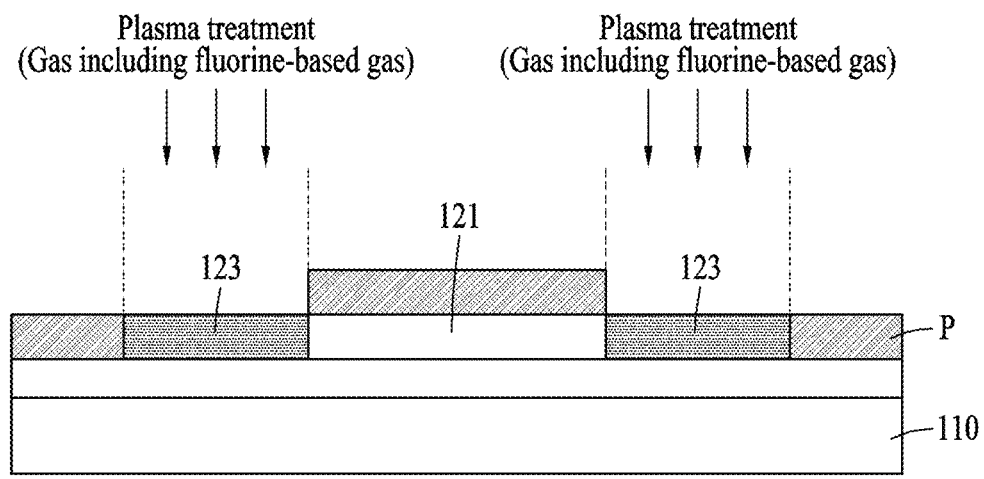
FIG. 1B is a diagram schematically illustrating a process of selectively plasma-treating a source region and a drain region of an oxide semiconductor layer with a fluorine-based gas.

FIG. 1B is a diagram schematically illustrating a process of selectively plasma-treating a source region and a drain region of an oxide semiconductor layer with a fluorine-based gas.

After forming the oxide semiconductor layer, a photoresist (P) is applied onto a substrate 110 and a channel region 121 of the oxide semiconductor layer, and the photoresist (P) is subjected to photolithography using a mask including a predetermined pattern. In this process, a source region 122 and a drain region 123 of the oxide semiconductor layer may be exposed to the outside.

Then, in a vacuum state, a temperature of about 390° C. and a plasma of 200 W power are applied. In this process, the fluorine-based gas containing fluorine (F) may be injected at a flow rate of 20 sccm to perform plasma treatment of the source and drain regions 122 and 123.

When plasma treatment is completed, the photoresist (P) may be removed through etching.

The fluorine-based gas may include at least one of carbon tetrafluoride ($CF_4$), nitrogen trifluoride ($NF_3$), and sulfur hexafluoride ($SF_6$).

When plasma treatment is performed, an unstable characteristic is exhibited when process temperature is increased, and thus plasma treatment may be performed at a temperature of 20° C. to 420° C.

In addition, when plasma treatment is performed, the concentration of fluorine doped in the source and drain regions 122 and 123 may be controlled by adjusting power and the flow rate of gas. For example, when plasma treatment is performed, a power of 100 W to 300 W may be applied and the flow rate of the fluorine-based gas may be controlled to 10 sccm to 30 sccm.

The source and drain regions 122 and 123 are plasma-treated with the fluorine-based gas to contain fluorine (F) at a concentration of $2 \times 10^{14}/cm^3$ to $17.5 \times 10^{21}/cm^3$. When the source and drain regions 122 and 123 of the oxide semiconductor layer contain fluorine at the above-described concentration, the resistivity of the source and drain regions 122 and 123 may be reduced, thereby improving the electrical characteristics of the oxide semiconductor thin-film transistor.

In addition, when IGZO is used as the oxide semiconductor layer, the oxide semiconductor layer may include oxygen (O), indium (In), gallium (Ga), and zinc (Zn). The oxide semiconductor layer may further include silicon (Si) due to the presence of the insulating layers (buffer layer and gate insulating layer) formed above and below the oxide semiconductor layer.

However, in the method of fabricating an oxide semiconductor thin-film transistor according to an embodiment of the present invention, since the source and drain regions 122 and 123 of the oxide semiconductor layer are plasma-treated with the fluorine-based gas, the oxide semiconductor layer may contain oxygen (O), indium (In), gallium (Ga), zinc (Zn), and silicon (Si), and may further include fluorine. In this case, fluorine may be contained in an amount of 0.1% to 15% in the source and drain regions 122 and 123 of the oxide semiconductor layer. When fluorine is contained within the above-range, the resistivity of the source and drain regions 122 and 123 may be reduced, thereby improving the electrical characteristics of the oxide semiconductor thin-film transistor.

In addition, by plasma-treating the source and drain regions 122 and 123 of the oxide semiconductor layer with the fluorine-based gas, the oxygen vacancies of the source and drain regions 122 and 123 of the oxide semiconductor layer may be adjusted, thereby improving the reliability of the oxide semiconductor thin-film transistor.

The oxide semiconductor layer contains a number of oxygen vacancies, which is an inherent defect in the oxide semiconductor layer. These oxygen vacancies act as a factor to increase carrier concentration in the oxide semiconductor layer. When an excess of oxygen vacancies is present, the electrical performance and the reliability of the oxide semiconductor thin-film transistor may be affected.

However, in the case of the method of fabricating an oxide semiconductor thin-film transistor according to an embodiment of the present invention, since the source and drain regions 122 and 123 of the oxide semiconductor layer are plasma-treated with the fluorine (F)-based gas and the fluorine (F)-based gas diffuses into the source and drain regions 122 and 123 of the oxide semiconductor layer, oxygen vacancies included in the source and drain regions 122 and 123 of the oxide semiconductor layer may be reduced, thereby improving the reliability of the oxide semiconductor layer.

More specifically, fluorine may diffuse into the source and drain regions 122 and 123 of the oxide semiconductor layer so that oxygen vacancies present inside the source and drain regions 122 and 123 may be filled with fluorine. Supply of carriers may be increased due to fluorine, which increases the concentration of the carriers, thereby improving the mobility of the oxide semiconductor thin-film transistor.

For example, since the source and drain regions 122 and 123 are plasma-treated with the fluorine-based gas, the source and drain regions 122 and 123 of the oxide semiconductor layer may have a concentration of oxygen vacancies of 15% to 35%. When the source and drain regions 122 and 123 include oxygen vacancies within the above-described range, metallic characteristics may be acquired due to decrease in resistivity, so that the oxide semiconductor thin-film transistor may have stable electrical properties.

In addition, since the source and drain regions 122 and 123 are plasma-treated with the fluorine-based gas, metallic characteristics may be exhibited due to decrease in the resistivity of the source and drain regions 122 and 123. For example, the source and drain regions 122 and 123 of the oxide semiconductor layer may have a resistivity of $1 \times 10^2$ $\Omega \cdot cm$ to $3 \times 10^{-3}$ $\Omega \cdot cm$. When the source and drain regions 122 and 123 have a resistivity value within the above-described range, the oxide semiconductor thin-film transistor may have stable electrical properties.

In addition, since the source and drain regions 122 and 123 are plasma-treated with the fluorine-based gas, the surface roughness of the source and drain regions 122 and 123 of the oxide semiconductor layer may be reduced. For example, when the source and drain regions 122 and 123 are plasma-treated with the fluorine-based gas, the source and drain regions 122 and 123 may have a surface roughness of 0.09 nm.

In addition, since the source and drain regions 122 and 123 are plasma-treated with the fluorine-based gas, the fluorine-based gas may diffuse on the surfaces of the source and drain regions 122 and 123.

Accordingly, fluorine may diffuse to a depth of 5 nm to 20 nm from the surfaces of the source and drain regions 122 and 123 of the oxide semiconductor layer.

According to the method of fabricating an oxide semiconductor thin-film transistor according to an embodiment of the present invention, the oxide semiconductor layer may have a depth of 10 nm to 50 nm. When the depth of the oxide semiconductor layer is less than 10 nm, due to very thin thickness, thickness may be non-uniform, causing a problem of current reduction.

In addition, according to the method of fabricating an oxide semiconductor thin-film transistor according to an embodiment of the present invention, since the source and drain regions 122 and 123 are plasma-treated, the source and drain regions 122 and 123 of the oxide semiconductor layer have low resistance due to the presence of fluorine. Accordingly, ohmic contact characteristics between the oxide semiconductor layer and source and drain electrodes 151 and 152 may be improved.

In addition, since the temperature stability of the oxide semiconductor layer is increased, reliability with respect to temperature applied in additional processes to be performed after the oxide semiconductor layer is formed may be improved.

In addition, since the plasma-treated source and drain regions 122 and 123 have conductivity, the source and drain regions 122 and 123 in combination with the source and drain electrodes may be used as electrodes.

According to the method of fabricating an oxide semiconductor thin-film transistor according to an embodiment of the present invention, by performing plasma treatment with the fluorine-based gas, fluorine may diffuse on the surfaces of the source and drain regions 122 and 123 of the oxide semiconductor layer, and fluorine may diffuse to a depth of 5 nm to 20 nm from the surfaces of the source and drain regions 122 and 123 of the oxide semiconductor layer.

According to an embodiment, step S120 of selectively plasma-treating the source and drain regions 122 and 123 of the oxide semiconductor layer with the fluorine-based gas may include a first plasma treatment step of selectively plasma-treating the source and drain regions 122 and 123 of the oxide semiconductor layer with the fluorine (F)-based gas and a second plasma treatment step of performing plasma treatment to decompose the fluorine-based gas in the first and second offset regions.

In the first plasma treatment step, to selectively plasma-treat the source and drain regions 122 and 123 of the oxide semiconductor layer with the fluorine (F)-based gas, a fluorine-based gas such as carbon tetrafluoride ($CF_4$), nitrogen trifluoride ($NF_3$), or sulfur hexafluoride ($SF_6$) may be used. To dope the first and second offset regions with fluorine, the fluorine-based gas used in the first plasma treatment step may be decomposed in the second plasma treatment step.

For example, when sulfur hexafluoride ($SF_6$) is used in the first plasma treatment step, sulfur hexafluoride ($SF_6$) may be decomposed in the second plasma treatment step as shown in Equation 1 below, and the first and second offset regions may be doped with fluorine.

$$SF_6 \rightarrow SF_5^+ + F^- \qquad \text{[Equation 1]}$$

Accordingly, the first and second offset regions are plasma-treated with the fluorine-based gas to contain fluorine (F) at a concentration of $2 \times 10^{14}/cm^3$ to $17.5 \times 10^{21}/cm^3$. When the first and second offset regions of the oxide semiconductor layer contain fluorine at the above-described concentration, the resistivity of the first and second offset regions may be reduced, thereby improving the electrical characteristics of the oxide semiconductor thin-film transistor.

In addition, since the first and second offset regions are plasma-treated with the fluorine-based gas, the resistivity of the first and second offset regions may be reduced, so that metallic characteristics may be exhibited. For example, the first and second offset regions of the oxide semiconductor layer may have a resistivity of $1 \times 10^2$ Ω·cm to $3 \times 10^{-3}$ Ω·cm. When the first and second offset regions have a resistivity value within the above-described range, the oxide semiconductor thin-film transistor may exhibit stable electrical properties.

Accordingly, only the first and second offset regions of the oxide semiconductor layer may be selectively plasma-treated.

FIG. 1B illustrates that the source and drain regions 122 and 123 are plasma-treated, but the first and second offset regions of the oxide semiconductor layer may be selectively plasma-treated.

Referring to FIG. 1A again, the method of fabricating an oxide semiconductor thin-film transistor according to an embodiment of the present invention includes step S130 of forming a gate insulating layer on the channel region.

The gate insulating layer may be formed to correspond to the channel region of the oxide semiconductor layer, and may electrically separate the channel region of the oxide semiconductor layer and the gate electrode from each other.

The gate insulating layer may include at least one of aluminum oxide ($Al_2O_3$), zirconium oxide ($ZrO_x$), zirconium aluminum oxide ($ZrAlO_x$), and hafnium oxide ($HfO_x$).

The gate insulating layer may be formed by spin coating using a solution for forming a gate insulating layer. Spin coating is performed by dropping a certain amount of a solution for forming a gate insulating layer on a substrate and rotating the substrate at a high speed to apply centrifugal force to the solution. When spin coating is used, compared to a deposition process, production cost may be reduced, and process cost and process time may be reduced through simplification of process technology.

The method of fabricating an oxide semiconductor thin-film transistor according to an embodiment of the present invention includes step S140 of forming a gate electrode on the gate insulating layer.

The gate electrode may include metals or metal oxides, which are electrically conductive materials. Specifically, the gate electrode may include at least one of metals such as molybdenum (Mo), aluminum (Al), chromium (Cr), gold (Au), titanium (Ti), and silver (Ag) and metal oxides such as indium tin oxide (ITO), indium zinc oxide (IZO), and indium tin zinc oxide (ITZO).

The gate electrode may be formed by depositing a gate film on a substrate, forming a photoresist pattern on the gate film, and then selectively etching, i.e., patterning, the gate film using the photoresist pattern as a mask.

The gate electrode may be formed by a deposition process such as chemical vapor deposition, physical vapor deposition, and atomic layer deposition.

According to an embodiment, the method of fabricating an oxide semiconductor thin-film transistor according to an embodiment of the present invention may further include a step of forming a protective layer on the substrate on which the gate electrode has been formed.

The protective layer may be formed to cover all of the oxide semiconductor layer, the gate insulating layer, and the gate electrode.

The protective layer may be formed by spin coating using a solution for forming a protective layer. Spin coating is performed by dropping a certain amount of a solution for forming a protective layer on a substrate and rotating the substrate at a high speed to apply centrifugal force to the solution. When spin coating is used, compared to a deposition process, production cost may be reduced, and process cost and process time may be reduced through simplification of process technology.

The protective layer may be formed of the same material as the gate insulating layer. For example, the protective layer may be formed in a single layer or multilayer structure composed of any one of silicon oxide and silicon nitride. However, the present invention is not limited thereto, and various materials may be used to form the protective layer.

The method of fabricating an oxide semiconductor thin-film transistor according to an embodiment of the present invention includes step S150 of forming a source electrode and a drain electrode on the source and drain regions, respectively.

The source and drain electrodes may be formed of a metal material. For example, the source and drain electrodes may be formed of any one of molybdenum (Mo), aluminum (Al), chromium (Cr), gold (Au), titanium (Ti), nickel (Ni), neodymium (Nd), and copper (Cu) or a combination thereof. However, the present invention is not limited thereto, and various materials may be used to form the source and drain electrodes.

The source and drain electrodes may be formed by etching the protective layer to form contact holes so that the source and drain regions are exposed, and then depositing source and drain conductive films for forming the source and drain electrodes in the contact holes.

More specifically, the source and drain electrodes may be formed by etching the protective layer to form contact holes so that the source and drain regions are exposed, depositing source and drain conductive films, forming a photoresist pattern on the source and drain conductive films, and then patterning the source and drain conductive films using the photoresist pattern as a mask. In this case, the source and drain electrodes may extend into the contact holes to contact (electrically connect to) the source and drain regions.

In addition, when viewed in a direction perpendicular to the substrate, the oxide semiconductor layer includes the first and second offset regions formed between the gate electrode and the source electrode and between the gate electrode and the drain electrode, respectively. Thus, the widths of the first and second offset regions may be adjusted according to the portions of the source and drain electrodes in contact with (electrically connected to) the source and drain regions when the source and drain electrodes extend into the contact holes.

The first and second offset regions will be described in detail with reference to FIG. 2.

Figure 2:
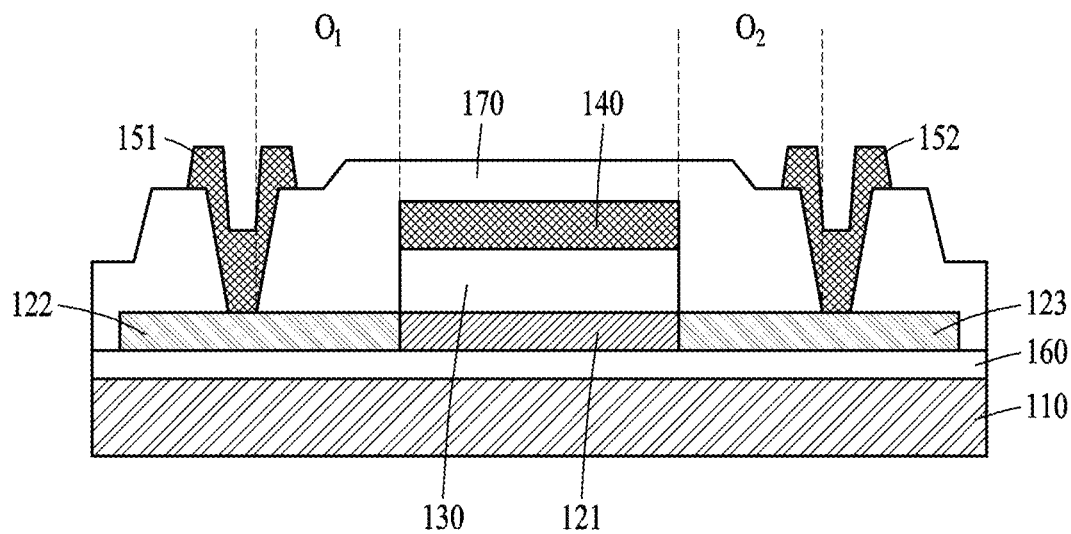
FIG. 2 is a cross-sectional view of an oxide semiconductor thin-film transistor according to an embodiment of the present invention.

FIG. 2 is a cross-sectional view of an oxide semiconductor thin-film transistor according to an embodiment of the present invention.

The oxide semiconductor thin-film transistor according to an embodiment of the present invention includes the same components as the method of fabricating an oxide semiconductor thin-film transistor according to an embodiment of the present invention. Thus, repeated description thereof will be omitted.

The oxide semiconductor thin-film transistor according to an embodiment of the present invention may be used as a pixel element for driving a light-emitting diode constituting a display device.

The oxide semiconductor thin-film transistor according to an embodiment of the present invention includes an oxide semiconductor layer formed on the substrate 110 and including the channel region 121, the source region 122, and the drain region 123; a gate insulating layer 130 formed on the channel region 121 of the oxide semiconductor layer; a gate electrode 140 formed on the gate insulating layer 130; and the source and drain electrodes 151 and 152 formed on the source and drain regions 122 and 123 of the oxide semiconductor layer, respectively.

The oxide semiconductor thin-film transistor according to an embodiment of the present invention includes the substrate 110.

The substrate 110 is a base substrate used in the art for forming an oxide semiconductor thin-film transistor, and materials for forming the substrate are not particularly limited. For example, various materials such as silicon, glass, plastic, quartz, and metal foil may be used.

When a display device having the oxide semiconductor thin-film transistor according to an embodiment of the present invention is implemented as a transparent flexible display device, the substrate 110 may be formed of a transparent flexible material.

The substrate 110 may have a depth of 1 μm to 30 μm, preferably 1 μm to 10 μm.

According to an embodiment, the oxide semiconductor thin-film transistor according to an embodiment of the present invention may further include a buffer layer 160 on the substrate 110. Preferably, the buffer layer 160 is formed between the substrate 110 and the oxide semiconductor layer.

The buffer layer 160 may prevent penetration of external impurities such as moisture or oxygen through the substrate 110, and may planarize the surface of the substrate 110. However, the buffer layer 160 is not an essential configuration, and may be adopted or omitted depending on the type of the substrate 103.

In addition, when the buffer layer 160 is used, the buffer layer 160 may include at least one of inorganic materials such as silicon oxide ($SiO_x$), silicon nitride ($SiN_x$), and aluminum oxide ($AlO_x$) and organic materials such as acrylic and polyimide.

The oxide semiconductor thin-film transistor according to an embodiment of the present invention includes the oxide semiconductor layer including the channel region 121 and the source and drain regions 122 and 123.

The oxide semiconductor layer may be formed by using a photoresist pattern as a mask, and may be formed to include the channel region 121 and the source and drain regions 122 and 123.

In particular, since the source and drain regions 122 and 123 of the oxide semiconductor layer are plasma-treated with the fluorine (F)-based gas, the source and drain regions 122 and 123 may include fluorine (F) at a concentration of $2 \times 10^{14}/cm^3$ to $17.5 \times 10^{21}/cm^3$. When the source and drain regions 122 and 123 include fluorine (F) within the above-described range, the resistivity of the source and drain regions 122 and 123 may be reduced, thereby improving the electrical characteristics of the oxide semiconductor thin-film transistor.

In addition, when IGZO is used as the oxide semiconductor layer, the oxide semiconductor layer may include oxygen (O), indium (In), gallium (Ga), and zinc (Zn). The oxide semiconductor layer may further include silicon (Si) due to the presence of the insulating layers (the buffer layer 160 and the gate insulating layer 130) formed above and below the oxide semiconductor layer.

However, in the oxide semiconductor thin-film transistor according to an embodiment of the present invention, since the source and drain regions 122 and 123 of the oxide semiconductor layer are plasma-treated with the fluorine-based gas, the oxide semiconductor layer may contain oxygen (O), indium (In), gallium (Ga), zinc (Zn), and silicon (Si), and may further include fluorine. In this case, fluorine may be contained in an amount of 0.1% to 15% in the source and drain regions 122 and 123 of the oxide semiconductor layer. When fluorine is contained within the above-range, the resistivity of the source and drain regions 122 and 123 may be reduced, thereby improving the electrical characteristics of the oxide semiconductor thin-film transistor.

In addition, by plasma-treating the source and drain regions 122 and 123 of the oxide semiconductor layer with the fluorine-based gas, the oxygen vacancies of the source and drain regions 122 and 123 of the oxide semiconductor layer may be adjusted, thereby improving the reliability of the oxide semiconductor thin-film transistor.

The oxide semiconductor layer contains a number of oxygen vacancies, which is an inherent defect in the oxide semiconductor layer. These oxygen vacancies act as a factor to increase carrier concentration in the oxide semiconductor layer. When an excess of oxygen vacancies is present, the electrical performance and the reliability of the oxide semiconductor thin-film transistor may be affected.

However, in the case of the oxide semiconductor thin-film transistor according to an embodiment of the present invention, since the source and drain regions 122 and 123 of the oxide semiconductor layer are plasma-treated with the fluorine (F)-based gas and the fluorine (F)-based gas diffuses into the source and drain regions 122 and 123 of the oxide semiconductor layer, oxygen vacancies included in the source and drain regions 122 and 123 of the oxide semiconductor layer may be reduced, thereby improving the reliability of the oxide semiconductor layer.

More specifically, fluorine may diffuse into the source and drain regions 122 and 123 of the oxide semiconductor layer so that oxygen vacancies present inside the source and drain regions 122 and 123 may be filled with fluorine. Supply of carriers may be increased due to fluorine, which increases the concentration of the carriers, thereby improving the mobility of the oxide semiconductor thin-film transistor.

The source and drain regions 122 and 123 of the oxide semiconductor layer may have a concentration of oxygen vacancies of 15% to 35%. When the source and drain regions 122 and 123 include oxygen vacancies within the above-described range, metallic characteristics may be acquired due to decrease in resistivity, so that the oxide semiconductor thin-film transistor may have stable electrical properties.

Since the source and drain regions 122 and 123 of the oxide semiconductor thin-film transistor according to an embodiment of the present invention are plasma-treated with the fluorine-based gas, metallic characteristics may be acquired due to decrease in the resistivity of the source and drain regions 122 and 123. For example, the source and drain regions 122 and 123 may have a resistivity of $1 \times 10^2$ $\Omega \cdot cm$ to $3 \times 10^{-3}$ $\Omega \cdot cm$. When the source and drain regions 122 and 123 have a resistivity value within the above-described range, the oxide semiconductor thin-film transistor may have stable electrical properties.

In addition, the surface roughness of the plasma-treated source and drain regions 122 and 123 may be reduced. For example, when the source and drain regions 122 and 123 are plasma-treated with the fluorine-based gas, the source and drain regions 122 and 123 may have a surface roughness of 0.09 nm.

The fluorine-based gas may include at least one of carbon tetrafluoride ($CF_4$), nitrogen trifluoride ($NF_3$), and sulfur hexafluoride ($SF_6$).

In addition, since the source and drain regions 122 and 123 are plasma-treated with the fluorine-based gas, the fluorine-based gas may diffuse on the surfaces of the source and drain regions 122 and 123.

Accordingly, fluorine may diffuse to a depth of 5 nm to 20 nm from the surfaces of the source and drain regions 122 and 123 of the oxide semiconductor layer.

In the oxide semiconductor thin-film transistor according to an embodiment of the present invention, the oxide semiconductor layer may have a depth of 10 nm to 50 nm. When the depth of the oxide semiconductor layer is less than 10 nm, due to very thin thickness, thickness may be non-uniform, causing a problem of current reduction.

In addition, in the oxide semiconductor thin-film transistor according to an embodiment of the present invention, since the source and drain regions 122 and 123 are plasma-treated, the source and drain regions 122 and 123 of the oxide semiconductor layer have low resistance due to the presence of fluorine. Accordingly, ohmic contact characteristics between the oxide semiconductor layer and the source and drain electrodes 151 and 152 may be improved.

In addition, since the temperature stability of the oxide semiconductor layer is increased, reliability with respect to temperature applied in additional processes to be performed after the oxide semiconductor layer is formed may be improved.

In addition, since the plasma-treated source and drain regions 122 and 123 have conductivity, the source and drain regions 122 and 123 in combination with the source and drain electrodes 151 and 152 may be used as electrodes.

In addition, when viewed in a direction perpendicular to the substrate 110, the oxide semiconductor layer may include first and second offset regions $O_1$ and $O_2$ formed between the gate electrode 140 and the source electrode 151 and between the gate electrode 140 and the drain electrode 152, respectively.

More specifically, when viewed in a direction perpendicular to the substrate 110, the first offset region $O_1$ may correspond to a region from a portion where the source electrode 151 contacts the source region 122 of the oxide semiconductor layer to one end of the gate electrode 140, and the second offset region $O_2$ may correspond to a region from a portion where the drain electrode 152 contacts the drain region 123 of the oxide semiconductor layer to the other end of the gate electrode 140.

In the case of the oxide semiconductor thin-film transistor according to an embodiment of the present invention, after the oxide semiconductor layer is formed, many additional processes are performed at the upper interface of the oxide semiconductor layer. The upper interface of the oxide semiconductor layer contains more defects than the lower interface thereof.

However, in the case of the oxide semiconductor thin-film transistor according to an embodiment of the present invention, since the first and second offset regions $O_1$ and $O_2$ are formed, and the first and second offset regions $O_1$ and $O_2$ include a specific concentration of fluorine, defective areas formed at the upper interface of the oxide semiconductor layer may be reduced, and thus change in threshold voltage at positive bias stress (PBS) may be reduced, thereby improving the electrical properties of the oxide semiconductor thin-film transistor.

Accordingly, in the case of the oxide semiconductor thin-film transistor according to an embodiment of the present invention, by including the first and second offset regions $O_1$ and $O_2$, drain current may be reduced, and the electrical properties of the oxide semiconductor thin-film transistor may be controlled, thereby complementing the electrical properties of the oxide semiconductor thin-film transistor.

That is, when the oxide semiconductor thin-film transistor according to an embodiment of the present invention is driven, parasitic voltage is reduced or cut off by the first and second offset regions $O_1$ and $O_2$, and electrical properties and reliability may be improved.

In addition, in the case of the oxide semiconductor thin-film transistor according to an embodiment of the present invention, by adjusting the widths of the first and second offset regions $O_1$ and $O_2$, the channel width of the oxide semiconductor layer may be increased to control the electrical properties of the oxide semiconductor thin-film transistor.

The first and second offset regions $O_1$ and $O_2$ may each have a width of 0.5 μm or more. When the first and second offset regions $O_1$ and $O_2$ have a width of less than 0.5 μm, leakage current or parasitic voltage may occur between the gate electrode 140 and the source and drain electrodes 151 and 152. In particular, in the case of a structure without the first and second offset regions $O_1$ and $O_2$, leakage current and parasitic voltage occur between electrodes, resulting in deterioration in the electrical properties of an oxide semiconductor thin-film transistor.

In addition, when the widths $W_1$ and $W_2$ of the first and second offset regions $O_1$ and $O_2$ are too wide, the source and drain regions 122 and 123 of the oxide semiconductor layer corresponding to the offset regions have high resistance, resulting in deterioration in the electrical properties of a device. Accordingly, the maximum values of the widths $W_1$ and $W_2$ may be designed to be appropriate values within a range that does not deteriorate the electrical characteristics of a device by a person skilled in the art (designer or manufacturer) according to the size or process characteristics of the oxide semiconductor thin-film transistor.

The first and second offset regions $O_1$ and $O_2$ may each have a width of 0.5 μm to 12 μm.

When the first and second offset regions $O_1$ and $O_2$ have low resistance, difference in characteristics according to the widths of the first and second offset regions $O_1$ and $O_2$ is insignificant. When the first and second offset regions $O_1$ and $O_2$ have insufficient resistance, as the width increases, resistance increases. Thus, the electrical properties of the oxide semiconductor thin-film transistor may be controlled according to the widths of the first and second offset regions $O_1$ and $O_2$.

In particular, since the first and second offset regions $O_1$ and $O_2$ are plasma-treated, the oxide semiconductor thin-film transistor according to an embodiment of the present invention may exhibit stable electrical properties at 0.5 μm to 12 μm.

The first and second offset regions $O_1$ and $O_2$ may have the same width ($W_1=W_2$), or may have different widths ($W_1 \neq W_2$). Specifically, when the distance between the source electrode 251 and the gate electrode 140 and the distance between the drain electrode 251 and the gate electrode 140 are the same, the first and second offset regions $O_1$ and $O_2$ may have the same width ($W_1=W_2$).

On the other hand, when the distance between the source electrode 251 and the gate electrode 140 and the distance between the drain electrode 251 and the gate electrode 140 are different, the first and second offset regions $O_1$ and $O_2$ may have different widths ($W_1 \neq W_2$).

The oxide semiconductor layer may include any one of amorphous indium gallium zinc oxide (a-IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc tin oxide (AZTO).

When describing the oxide semiconductor thin-film transistor according to an embodiment of the present invention, it has been described that the source and drain regions 122 and 123 of the oxide semiconductor layer are plasma-treated. However, only the first and second offset regions $O_1$ and $O_2$ of the oxide semiconductor layer may be plasma-treated. In addition, the characteristics of the first and second offset regions $O_1$ and $O_2$ of the oxide semiconductor layer plasma-treated with the fluorine-based gas may be the same as the characteristics of the source and drain regions 122 and 123 plasma-treated with the fluorine-based gas.

The oxide semiconductor thin-film transistor according to an embodiment of the present invention includes the gate insulating layer 130 formed on the channel region 121 of the oxide semiconductor layer.

The gate insulating layer 130 may be formed to correspond to the channel region 121 of the oxide semiconductor layer, and may electrically separate the channel region 121 of the oxide semiconductor layer and the gate electrode 140 from each other.

The gate insulating layer 130 may include at least one of aluminum oxide ($Al_2O_3$), zirconium oxide ($ZrO_x$), zirconium aluminum oxide ($ZrAlO_x$), and hafnium oxide ($HfO_x$).

The oxide semiconductor thin-film transistor according to an embodiment of the present invention includes the gate electrode 140 formed on the gate insulating layer 130.

The gate electrode 140 may include metals or metal oxides, which are electrically conductive materials. Specifically, the gate electrode 140 may include at least one of metals such as molybdenum (Mo), aluminum (Al), chromium (Cr), gold (Au), titanium (Ti), and silver (Ag) and metal oxides such as indium tin oxide (ITO), indium zinc oxide (IZO), and indium tin zinc oxide (ITZO).

According to an embodiment, the oxide semiconductor thin-film transistor according to an embodiment of the present invention may further include a protective layer 170 formed on the gate electrode 140.

The protective layer 170 may be formed to cover all of the oxide semiconductor layer, the gate insulating layer 130, and the gate electrode 140.

The protective layer 170 may be formed of the same material as the gate insulating layer 130. For example, the protective layer 170 may be formed in a single layer or multilayer structure composed of any one of silicon oxide and silicon nitride. However, the present invention is not limited thereto, and various materials may be used to form the protective layer.

The oxide semiconductor thin-film transistor according to an embodiment of the present invention includes the source and drain electrodes 151 and 152 formed on the source and drain regions 122 and 123 of the oxide semiconductor layer, respectively.

The source and drain electrodes 151 and 152 may be formed of a metal material. For example, the source and drain electrodes 151 and 152 may be formed of any one of molybdenum (Mo), aluminum (Al), chromium (Cr), gold (Au), titanium (Ti), nickel (Ni), neodymium (Nd), and copper (Cu) or a combination thereof. However, the present invention is not limited thereto, and various materials may be used to form the source and drain electrodes 151 and 152.

Figure 3:
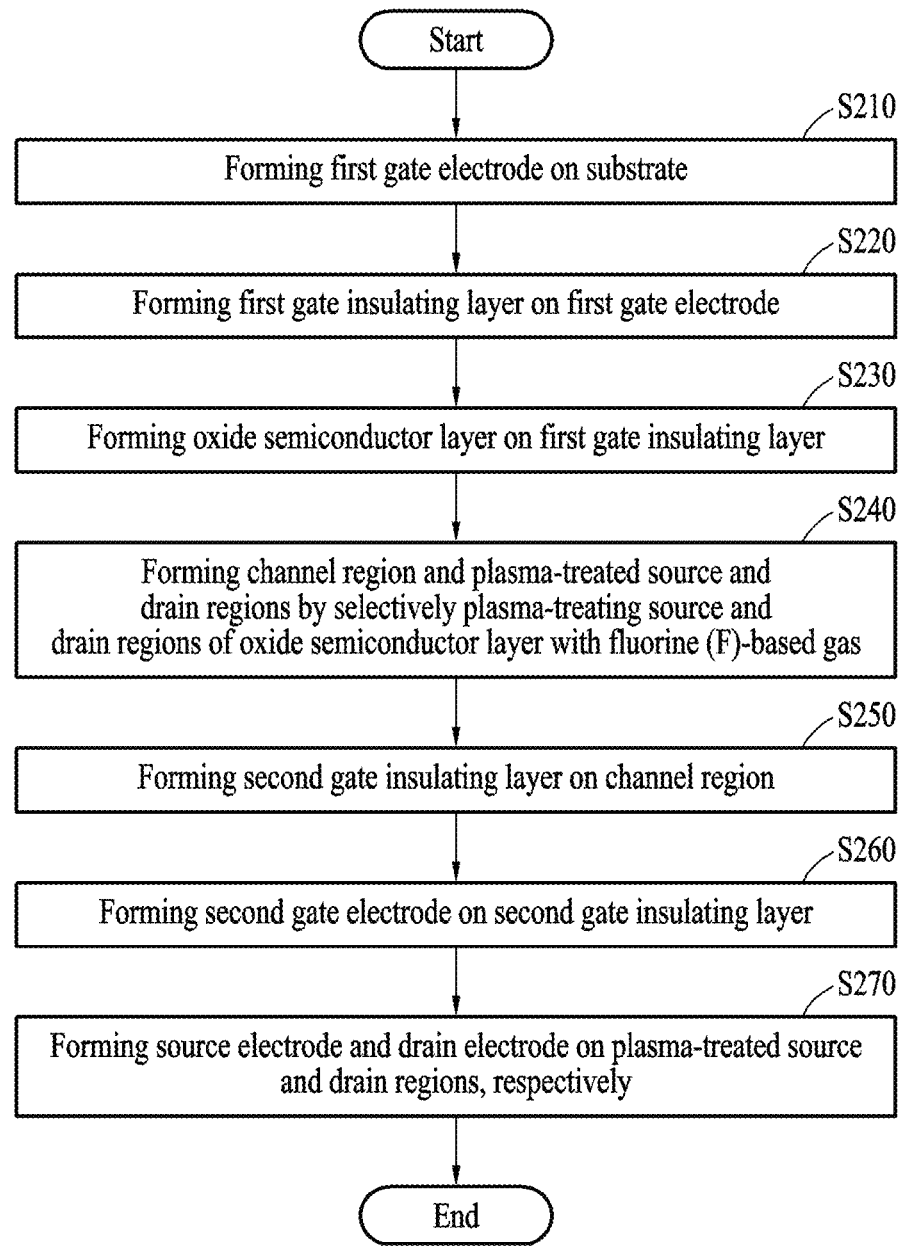
FIG. 3 is a flowchart for explaining a method of fabricating a dual gate thin-film transistor according to an embodiment of the present invention.

FIG. 3 is a flowchart for explaining a method of fabricating a dual gate thin-film transistor according to an embodiment of the present invention.

Except that the method of fabricating a dual gate thin-film transistor according to an embodiment of the present invention includes a first gate electrode and a second gate electrode, the method of fabricating a dual gate thin-film transistor includes the same components as the method of fabricating an oxide semiconductor thin-film transistor of the present invention and the oxide semiconductor thin-film transistor of the present invention. Thus, repeated description thereof will be omitted.

The method of fabricating a dual gate thin-film transistor according to an embodiment of the present invention includes step S210 of forming a first gate electrode on a substrate.

The first gate electrode may be formed by depositing a gate film on a substrate, forming a photoresist pattern on the gate film, and then selectively etching, i.e., patterning, the gate film using the photoresist pattern as a mask.

The method of fabricating a dual gate thin-film transistor according to an embodiment of the present invention includes step S220 of forming a first gate insulating layer on the first gate electrode.

The first gate insulating layer may be formed by spin coating using a solution for forming a first gate insulating layer. Spin coating is performed by dropping a certain amount of a solution for forming a first gate insulating layer on a substrate and rotating the substrate at a high speed to apply centrifugal force to the solution. When spin coating is used, compared to a deposition process, production cost may be reduced, and process cost and process time may be reduced through simplification of process technology.

The method of fabricating a dual gate thin-film transistor according to an embodiment of the present invention includes step S230 of forming an oxide semiconductor layer including a channel region, a source region, and a drain region on the first gate insulating layer.

The oxide semiconductor layer may be formed by depositing an oxide conductor layer on a substrate, forming a photoresist pattern on the oxide conductor layer, and then selectively etching, i.e., patterning, the oxide conductor layer using the photoresist pattern using a mask.

The method of fabricating a dual gate thin-film transistor according to an embodiment of the present invention includes step S240 of selectively plasma-treating the source and drain regions of the oxide semiconductor layer with a fluorine (F)-based gas.

After forming the oxide semiconductor layer, a photoresist (P) is applied onto the gate insulating layer and the channel region of the oxide semiconductor layer, and the photoresist (P) is subjected to photolithography using a mask including a predetermined pattern. In this process, in the oxide semiconductor layer, a region corresponding to the offset region and the source and drain regions may be exposed to the outside.

When plasma treatment is completed, the photoresist may be removed through etching.

Then, in a vacuum state, a temperature of about 390° C. and a plasma of 200 W power are applied. In this process, the fluorine-based gas containing fluorine (F) may be injected at a flow rate of 20 sccm to perform plasma treatment of the source region and the drain region.

The fluorine-based gas may include at least one of carbon tetrafluoride ($CF_4$), nitrogen trifluoride ($NF_3$), and sulfur hexafluoride ($SF_6$).

Accordingly, the source and drain regions are plasma-treated with the fluorine-based gas to contain fluorine (F) at a concentration of $2\times10^{14}/cm^3$ to $17.5\times10^{21}/cm^3$. When the source and drain regions contain fluorine within the above-described range, the resistivity of the source and drain regions may be reduced, thereby improving the electrical characteristics of the oxide semiconductor thin-film transistor.

In addition, fluorine may be included at a concentration of 0.1% to 15% in the source and drain regions of the oxide semiconductor layer. When fluorine is included within the above-described range, the resistivity of the source and drain regions may be reduced, thereby improving the electrical characteristics of the oxide semiconductor thin-film transistor.

In addition, since the source and drain regions are plasma-treated with the fluorine-based gas, the source and drain regions of the oxide semiconductor layer may have a concentration of oxygen vacancies of 15% to 35%. When the source and drain regions include oxygen vacancies within the above-described range, metallic characteristics may be acquired due to decrease in resistivity, so that the oxide semiconductor thin-film transistor may have stable electrical properties.

In addition, since the source and drain regions are plasma-treated with the fluorine-based gas, the source and drain regions of the oxide semiconductor layer may have a resistivity of $1\times10^2$ Ω·cm to $3\times10^{-3}$ Ω·cm. When the source and drain regions have a resistivity value within the above-described range, the oxide semiconductor thin-film transistor may exhibit stable electrical properties.

In addition, since the source and drain regions are plasma-treated with the fluorine-based gas, the surface roughness of the source and drain regions of the oxide semiconductor layer may be reduced. For example, when the source and drain regions are plasma-treated with the fluorine-based gas, the source and drain regions may have a surface roughness of 0.09 nm.

When viewed in a direction perpendicular to the substrate, the oxide semiconductor layer may include first and second offset regions formed between the second gate electrode and the source electrode and between the second gate electrode and the drain electrode, respectively.

According to an embodiment, step S240 of selectively plasma-treating the source and drain regions of the oxide semiconductor layer with the fluorine (F)-based gas may include a first plasma treatment step of selectively plasma-treating the source and drain regions of the oxide semiconductor layer with the fluorine (F)-based gas and a second plasma treatment step of performing plasma treatment to decompose the fluorine-based gas in the first and second offset regions.

To selectively plasma-treat the source and drain regions 122 and 123 of the oxide semiconductor layer in the first plasma treatment step, the fluorine-based gas such as carbon tetrafluoride ($CF_4$), nitrogen trifluoride ($NF_3$), or sulfur hexafluoride ($SF_6$) may be used. To dope the first and second offset regions of the oxide semiconductor layer with fluorine, the fluorine-based gas used in the first plasma treatment step may be decomposed in the second plasma treatment step.

Accordingly, the first and second offset regions are plasma-treated with the fluorine-based gas to contain fluorine (F) at a concentration of $2\times10^{14}/cm^3$ to $17.5\times10^{21}/cm^3$. When the first and second offset regions have fluorine within the above-described range, the resistivity of the first and second offset regions may be reduced, thereby improving the electrical characteristics of the oxide semiconductor thin-film transistor.

In addition, since the first and second offset regions are plasma-treated with the fluorine-based gas, the first and second offset regions of the oxide semiconductor layer may have a resistivity of $1\times10^2$ Ω·cm to $3\times10^{-3}$ Ω·cm. When the first and second offset regions have a resistivity value within the above-described range, the oxide semiconductor thin-film transistor may exhibit stable electrical properties.

Accordingly, only the first and second offset regions of the oxide semiconductor layer may be selectively plasma-treated.

FIG. 3 illustrates that the source and drain regions are plasma-treated, but the first and second offset regions of the oxide semiconductor layer may be selectively plasma-treated.

The method of fabricating a dual gate thin-film transistor according to an embodiment of the present invention includes step S250 of forming a second gate insulating layer on the channel region.

The second gate insulating layer may be formed by spin coating using a solution for forming a second gate insulating layer. Spin coating is performed by dropping a certain amount of a solution for forming a second gate insulating layer on a substrate and rotating the substrate at a high speed to apply centrifugal force to the solution. When spin coating is used, compared to a deposition process, production cost may be reduced, and process cost and process time may be reduced through simplification of process technology.

The method of fabricating a dual gate thin-film transistor according to an embodiment of the present invention includes step S260 of forming a second gate electrode on the second gate insulating layer.

The second gate electrode may be formed by depositing a gate film on a substrate, forming a photoresist pattern on the gate film, and then selectively etching, i.e., patterning, the gate film using the photoresist pattern as a mask.

The method of fabricating a dual gate thin-film transistor according to an embodiment of the present invention includes step S270 of forming source and drain electrodes on the source and drain regions, respectively.

According to an embodiment, the method of fabricating a dual gate thin-film transistor according to an embodiment of the present invention may further include a step of forming a protective layer on the substrate on which the second gate electrode has been formed.

The protective layer may be formed using the same material or the same method as the first gate insulating layer or the second gate insulating layer.

The source and drain electrodes may be formed by etching the protective layer to form contact holes so that the source and drain regions are exposed, and then depositing source and drain conductive films for forming the source and drain electrodes in the contact holes.

Figure 4:
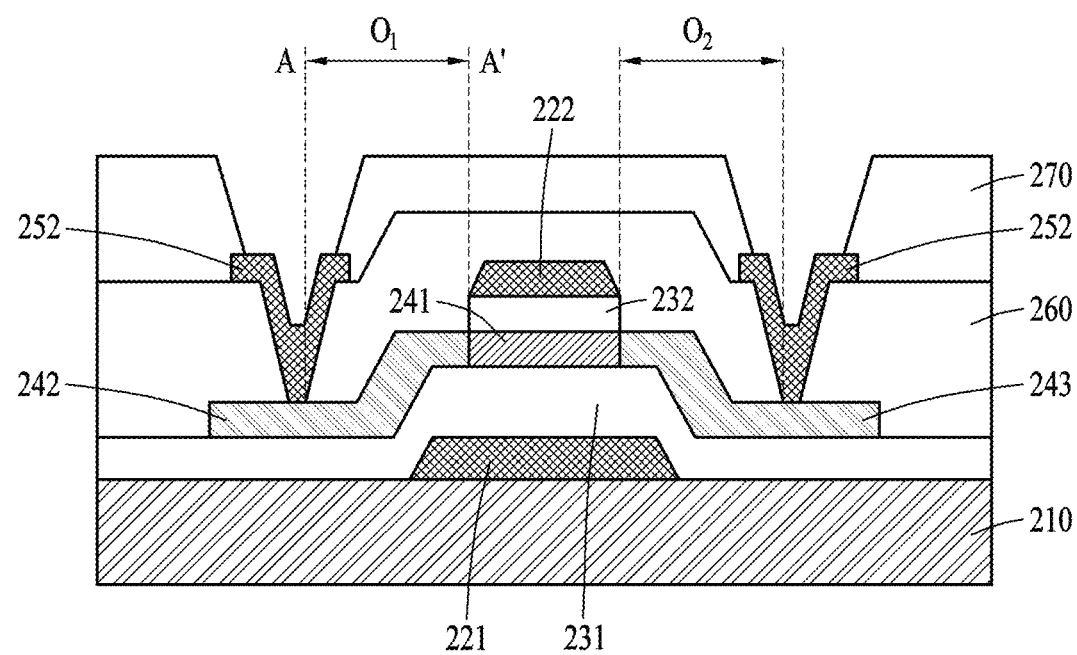
FIG. 4 is a cross-sectional view of a dual gate thin-film transistor according to an embodiment of the present invention.

FIG. 4 is a cross-sectional view of a dual gate thin-film transistor according to an embodiment of the present invention.

Except that the dual gate thin-film transistor according to an embodiment of the present invention includes a first gate electrode 221 and a second gate electrode 222, the dual gate thin-film transistor includes the same components as the method of fabricating an oxide semiconductor thin-film transistor of the present invention and the oxide semiconductor thin-film transistor of the present invention. Thus, repeated description thereof will be omitted.

The dual gate thin-film transistor according to an embodiment of the present invention includes the first gate electrode 221 formed on a substrate 210.

The first gate electrode 221 may be positioned at a lower position of an oxide semiconductor thin-film transistor, and may be a bottom gate electrode.

The dual gate thin-film transistor according to an embodiment of the present invention includes a first gate insulating layer 231 formed on the first gate electrode 221.

The first gate insulating layer 231 is formed on the substrate 210 to cover the first gate electrode 221, and serves to insulate the oxide semiconductor layer from the first gate electrode 221.

The dual gate thin-film transistor according to an embodiment of the present invention includes an oxide semiconductor layer formed on the first gate insulating layer 231 and including a channel region 241, a source region 242, and a drain region 243.

Since the source and drain regions 242 and 243 are plasma-treated with the fluorine-based gas, the source and drain regions 242 and 243 contain fluorine (F) at a concentration of $2 \times 10^{14}/cm^3$ to $17.5 \times 10^{21}/cm^3$. When the source and drain regions 242 and 243 contain fluorine within the above-described range, the resistivity of the source and drain regions 242 and 243 may be reduced, thereby improving the electrical characteristics of the oxide semiconductor thin-film transistor.

The source and drain regions 242 and 243 may have a resistivity of $1 \times 10^2$ Ω·cm to $3 \times 10^{-3}$ Ω·cm. When the source and drain regions 242 and 243 have a resistivity value within the above-described range, the oxide semiconductor thin-film transistor may exhibit stable electrical properties.

By plasma treatment of the source and drain regions 242 and 243, the fluorine-based gas may diffuse on the surfaces of the source and drain regions 242 and 243.

When viewed in a direction perpendicular to the substrate 210, the oxide semiconductor layer may include first and second offset regions $O_1$ and $O_2$ formed between the second gate electrode 222 and a source electrode 242 and between the second gate electrode 222 and a drain electrode 252, respectively.

Here, the first and second offset regions $O_1$ and $O_2$ may have the same width ($W_1 = W_2$), or may have different widths ($W_1 \neq W_2$). Specifically, when the first and second gate electrodes 221 and 222 are formed at the same location and in the same size, and the distance between the source electrode 251 and the first and second gate electrodes 221 and 2222 and the distance between the drain electrode 252 and the first and second gate electrodes 221 and 2222 are the same, the first and second offset regions $O_1$ and $O_2$ may have the same width ($W_1 = W_2$).

On the other hand, even when the first and second gate electrodes 221 and 222 are formed at the same location and in the same size, when the distance between the source electrode 251 and the first and second gate electrodes 221 and 222 and the distance between the drain electrode 252 and the first and second gate electrodes 221 and 222 are different, the first and second offset regions $O_1$ and $O_2$ may have different widths ($W_1 \neq W_2$).

In addition, when the first and second gate electrodes 221 and 222 are formed at different locations and in different sizes, the first and second offset regions $O_1$ and $O_2$ may have different widths ($W_1 \neq W_2$).

Preferably, the first and second offset regions $O_1$ and $O_2$ may each have a width of 0.5 μm or more, more preferably 0.5 μm to 12 μm.

Since the source and drain regions 242 and 243 of the oxide semiconductor layer are plasma-treated with the fluorine-based gas, the oxide semiconductor layer has low resistance duet to the presence of fluorine (F). Accordingly, ohmic contact characteristics between the oxide semiconductor layer and the source and drain electrodes 251 and 252 may be improved.

In addition, since the temperature stability of the oxide semiconductor layer is increased, reliability with respect to temperature applied in additional processes to be performed after the oxide semiconductor layer is formed may be improved.

In addition, in the oxide semiconductor layer, the source and drain regions 242 and 243 in contact with the source and drain electrodes 251 and 252 have conductivity by plasma treatment using the fluorine-based gas. Accordingly, the source and drain regions 242 and 243 in combination with the source and drain electrodes 251 and 252 may be used as electrodes.

The dual gate thin-film transistor according to an embodiment of the present invention includes a second gate insulating layer 232 formed on the channel region 241 of the oxide semiconductor layer.

The second gate insulating layer 232 may be formed to cover the channel region 241 of the oxide semiconductor layer, and may serve to insulate the channel region 241 of the oxide semiconductor layer from the second gate electrode 222.

The second gate insulating layer 232 may be formed using the same material or the same method as the first gate insulating layer 231.

The dual gate thin-film transistor according to an embodiment of the present invention includes the second gate electrode 222 formed on the second gate insulating layer 232.

The second gate electrode 222 may be positioned at an upper position of an oxide semiconductor thin-film transistor, and may be an upper gate electrode.

The first and second gate electrodes 221 and 222 may be formed to be physically separated from each other, or may be formed to be physically connected to each other via a connection electrode (not shown). When the same voltage is applied to the first and second gate electrodes 221 and 222, the width of a channel formed on the oxide semiconductor layer increases, so that the amount of current passing through the source and drain electrodes 251 and 252 increases.

According to an embodiment, the dual gate thin-film transistor according to an embodiment of the present invention may further include protective layers 260 and 270 formed on the second gate electrode 222.

The protective layers 260 and 270 may formed to cover all of the first gate electrode 221, the first gate insulating layer 231, the oxide semiconductor layer, the second gate insulating layer 232, and the second gate electrode 222.

The dual gate thin-film transistor according to an embodiment of the present invention includes the source and drain electrodes 251 and 252 formed on the source and drain regions 242 and 243 of the oxide semiconductor layer, respectively.

The source and drain electrodes 251 and 252 may be formed in a direction horizontal to each other on the source and drain regions 242 and 243.

Figure 5:
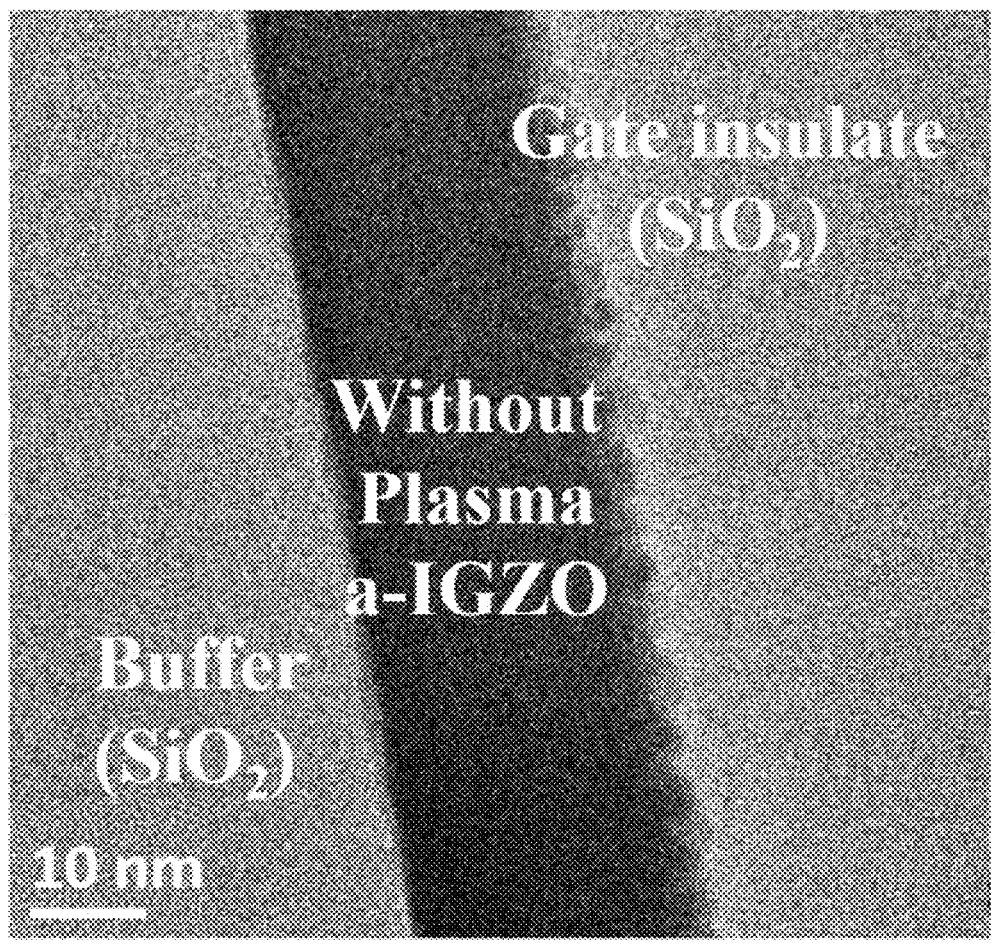
FIGS. 5 and 6 include a scanning electron microscope (SEM) image of an oxide semiconductor layer without plasma treatment and an image showing the surface roughness thereof, and FIGS. 7 and 8 include a scanning electron microscope (SEM) image of an oxide semiconductor layer with plasma treatment and an image showing the surface roughness thereof.
Figure 6:
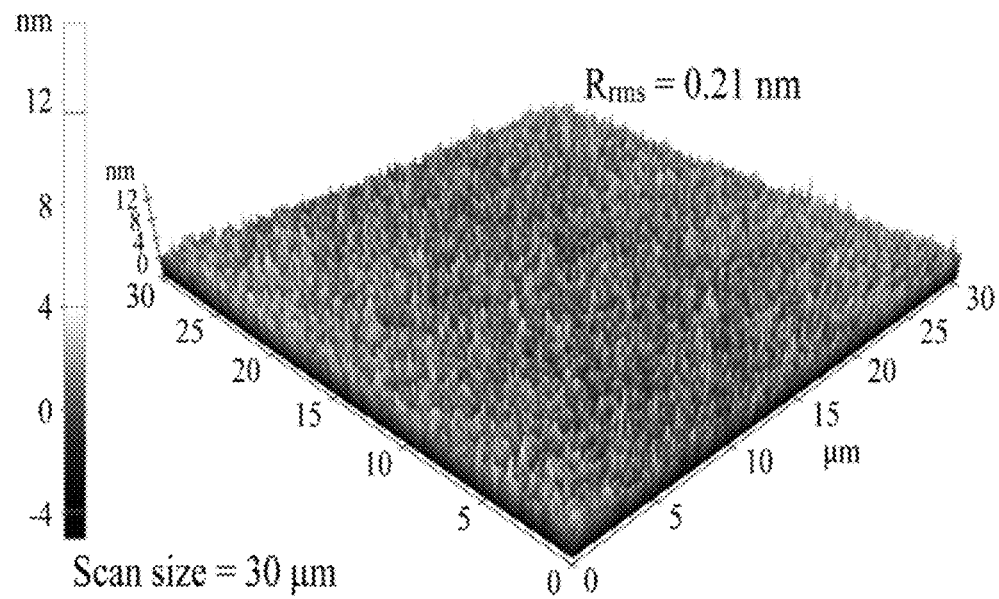
Figure 7:
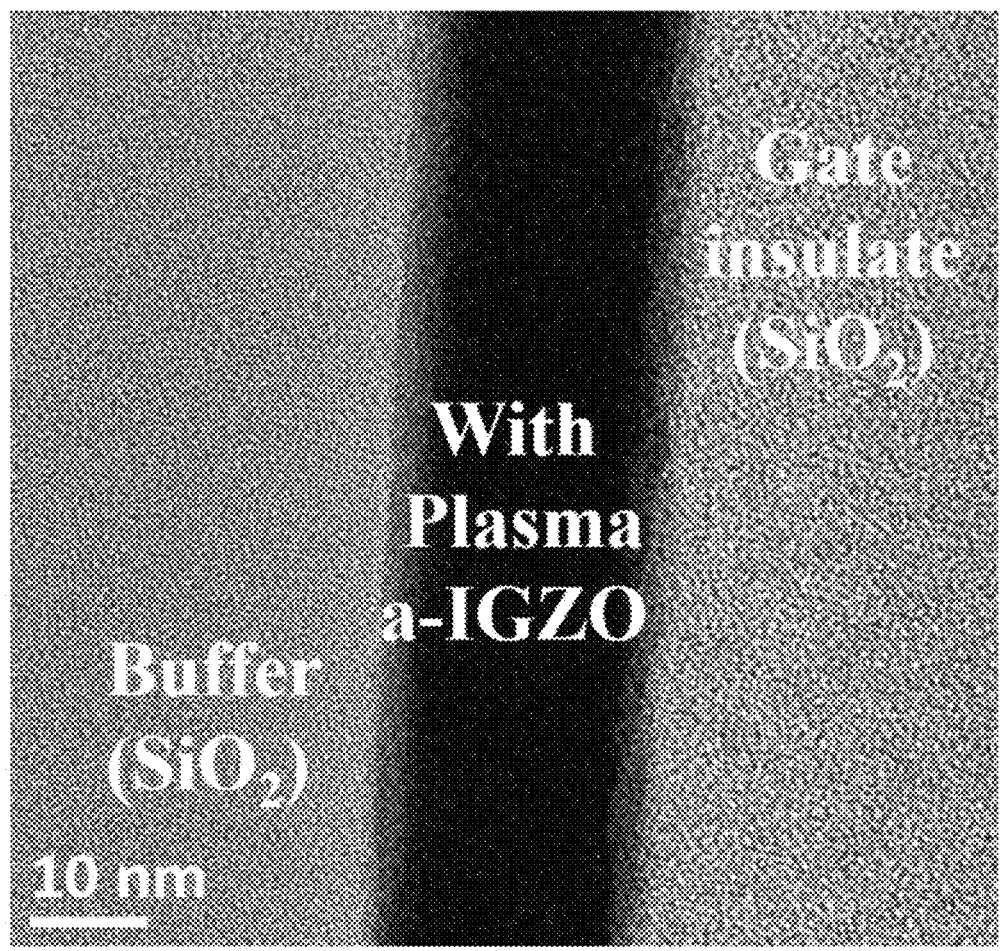
Figure 8:
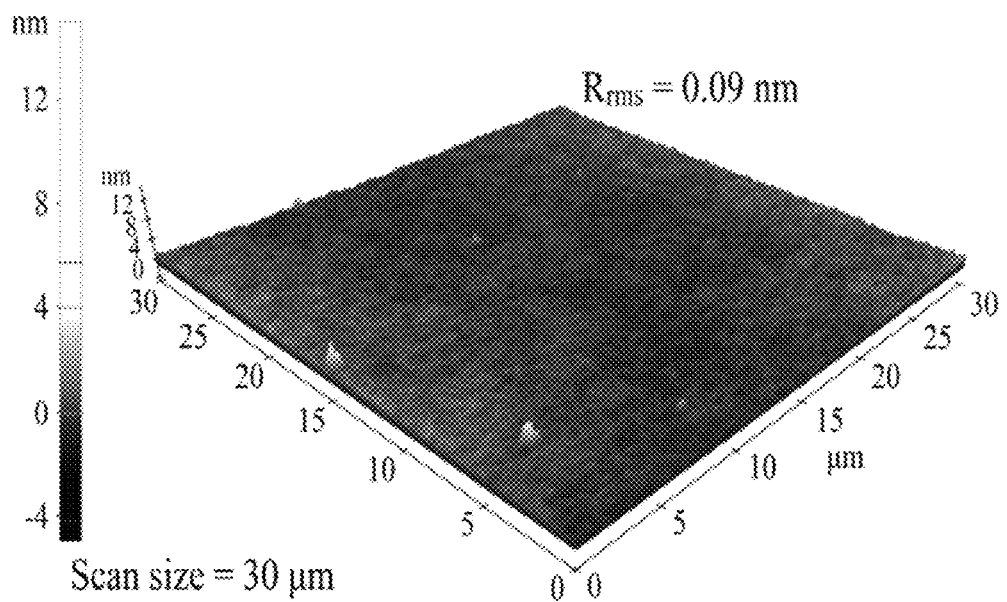

FIGS. 5 and 6 include a scanning electron microscope (SEM) image of an oxide semiconductor layer without plasma treatment and an image showing the surface roughness thereof, and FIGS. 7 and 8 include a scanning electron microscope (SEM) image of an oxide semiconductor layer with plasma treatment and an image showing the surface roughness thereof.

Referring to FIGS. 5 to 8, it can be confirmed that, when an oxide semiconductor layer is plasma-treated with a fluorine-based gas, the surface roughness of the plasma-treated oxide semiconductor layer decreases.

In particular, when the oxide semiconductor layer is plasma-treated with the fluorine-based gas, the surface roughness thereof decreases from 0.21 nm to 0.09 nm, and the roughness of a top interface is improved, thereby obtaining stable electrical properties.

Figure 9:
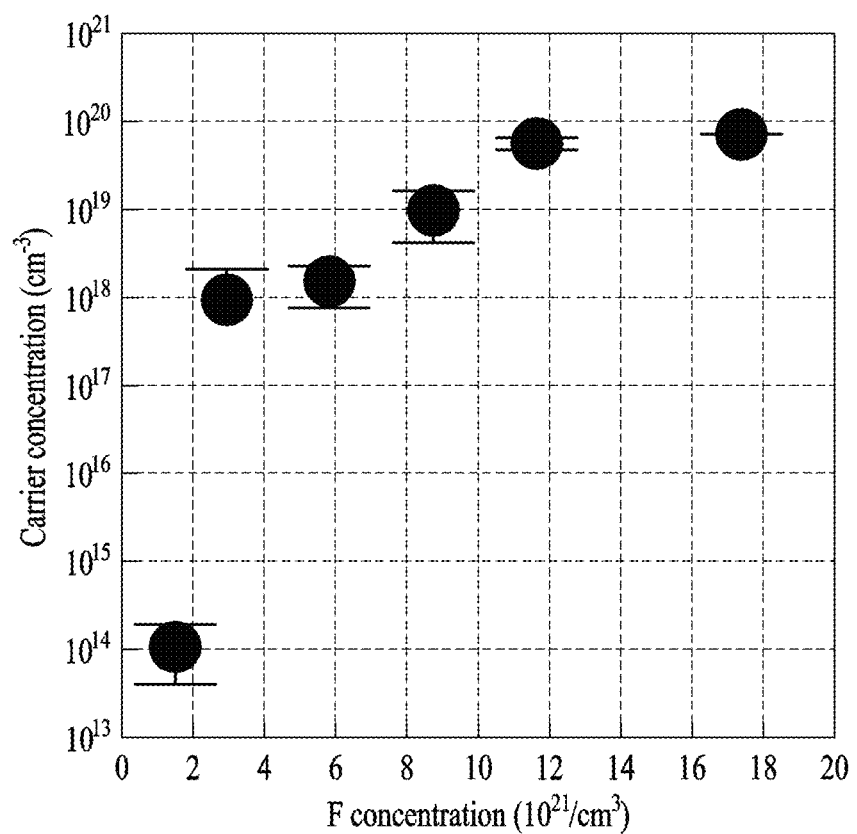
FIG. 9 is a graph showing carrier concentration depending on fluorine (F) concentration in a source region or a drain region included in an oxide semiconductor thin-film transistor according to an embodiment of the present invention.
Figure 10:
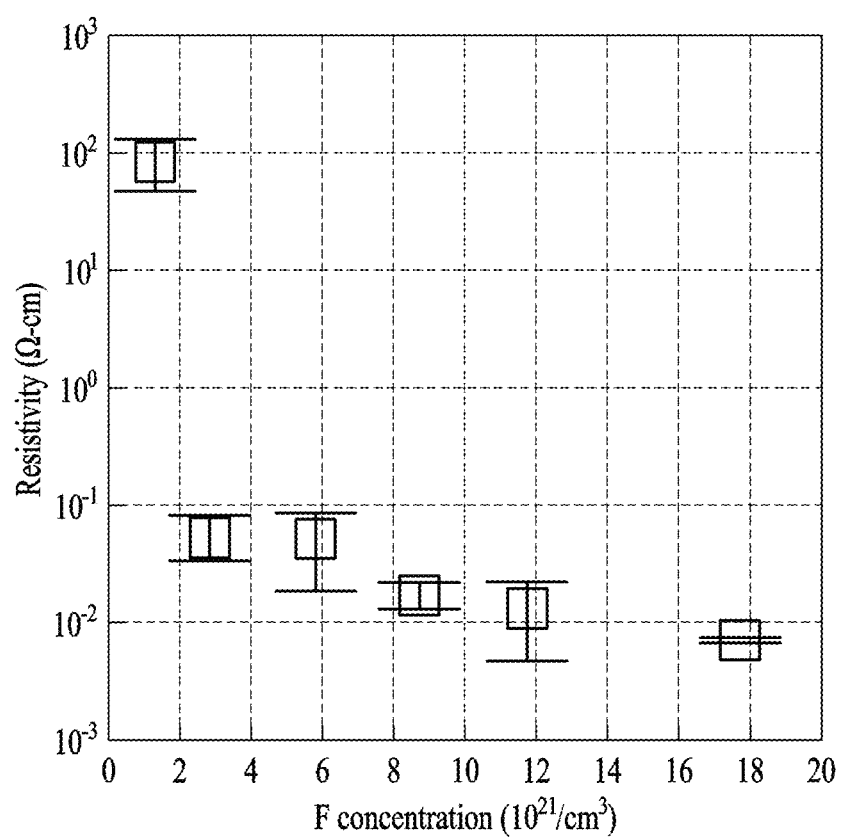
FIG. 10 is a graph showing resistivity depending on fluorine concentration.
Figure 11:
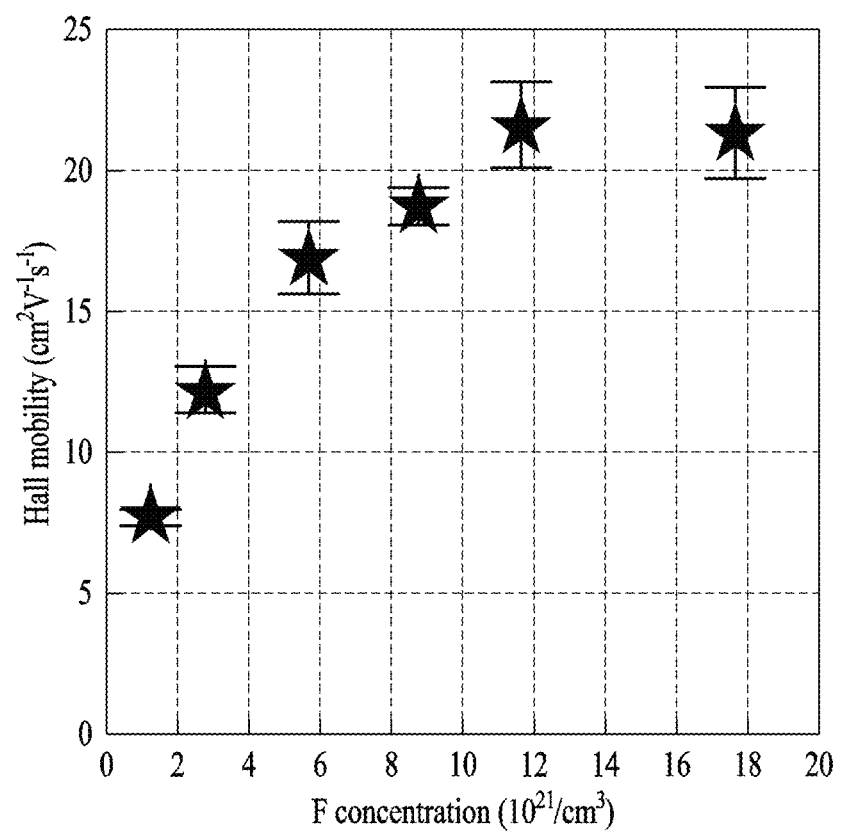
FIG. 11 is a graph showing Hall mobility depending on fluorine concentration.

FIG. 9 is a graph showing carrier concentration depending on fluorine (F) concentration in a source region or a drain region included in an oxide semiconductor thin-film transistor according to an embodiment of the present invention, FIG. 10 is a graph showing resistivity depending on fluorine concentration, and FIG. 11 is a graph showing Hall mobility depending on fluorine concentration.

Referring to FIGS. 9 to 11, as the concentration of fluorine in the source and drain regions increases, carrier concentration and Hall mobility increase, but resistivity decreases, indicating that the electrical properties and reliability of the oxide semiconductor layer are improved.

In particular, referring to FIG. 9, in the case of the oxide semiconductor thin-film transistor according to an embodiment of the present invention, when the source region or the drain region is plasma-treated, the concentration of fluorine in the source region or the drain region changes from $1.45 \times 10^{21}/cm^3$ to $15 \times 10^{21}/cm^3$, and the concentration of carriers in the source region or the drain region changes from $1 \times 10^{13}/cm^3$ to $6 \times 10^{19}/cm^3$. These data indicate that, by doping with fluorine, the characteristics of the source region or the drain region are converted from semiconductor characteristics into metallic characteristics.

Figure 12:
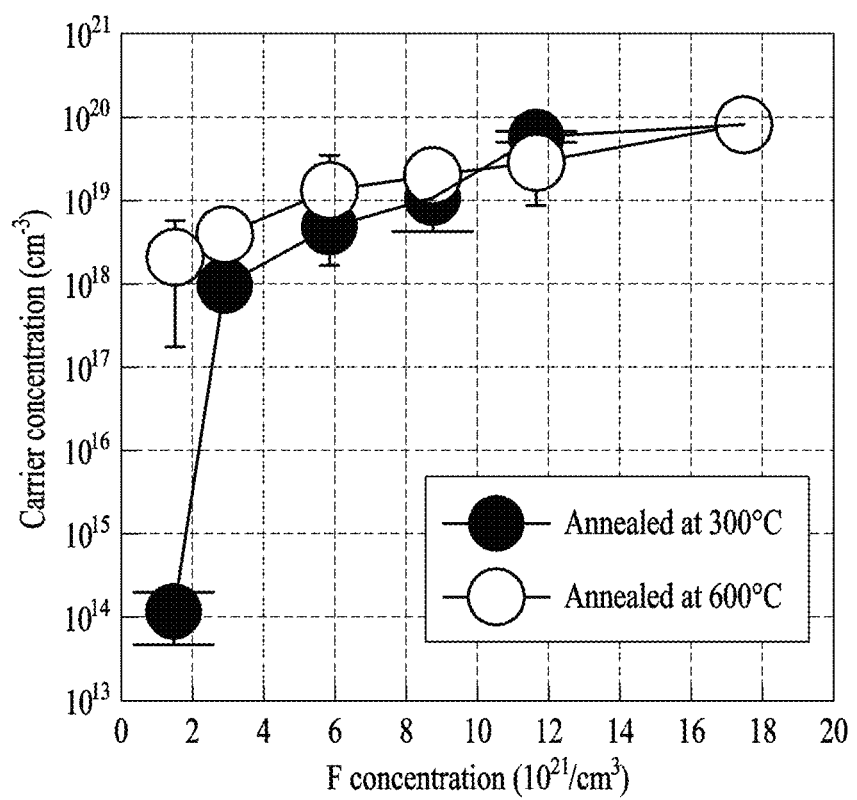
FIG. 12 is a graph showing carrier concentration depending on fluorine concentration in a source region or a drain region included in an oxide semiconductor layer transistor according to an embodiment of the present invention according to annealing temperature.
Figure 13:
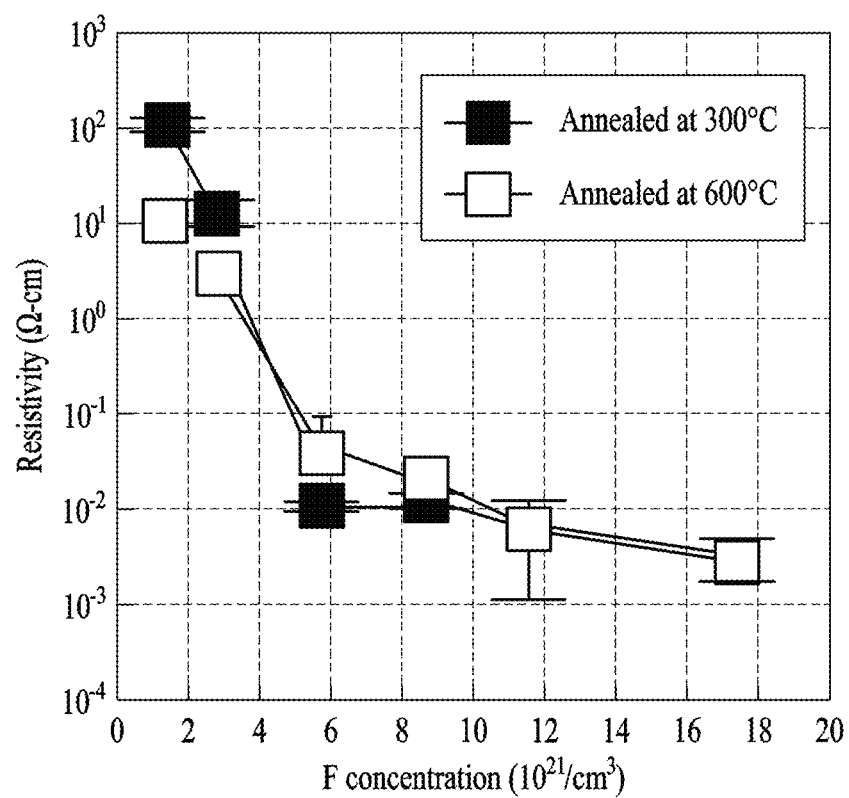
FIG. 13 is a graph showing resistivity depending on fluorine concentration.
Figure 14:
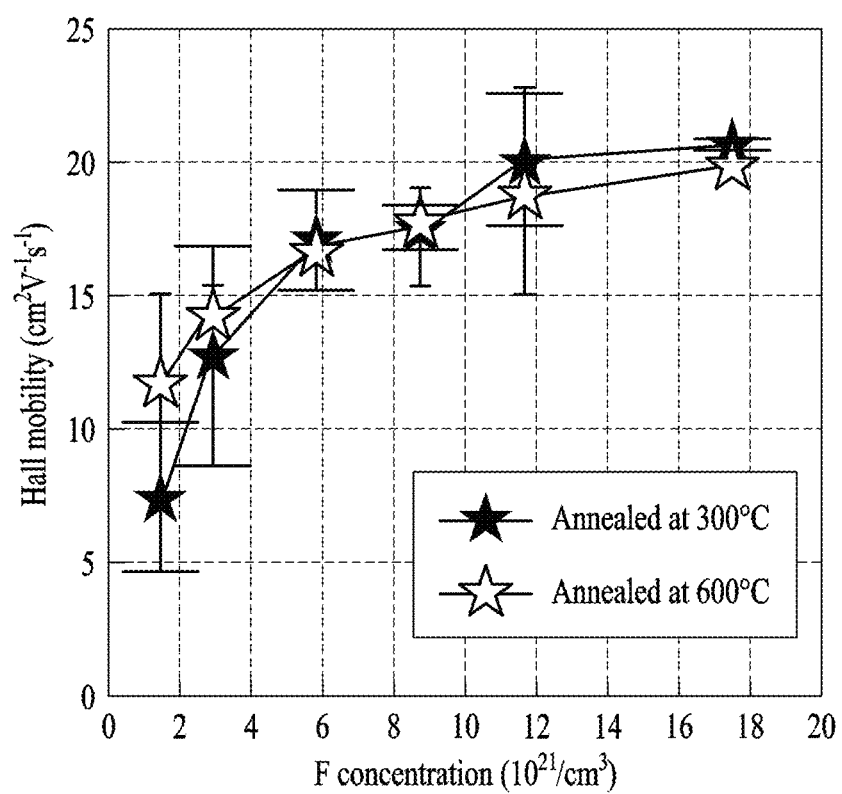
FIG. 14 is a graph showing Hall mobility depending on fluorine concentration.

FIG. 12 is a graph showing carrier concentration depending on fluorine concentration in a source region or a drain region included in an oxide semiconductor layer transistor according to an embodiment of the present invention according to annealing temperature, FIG. 13 is a graph showing resistivity depending on fluorine concentration, and FIG. 14 is a graph showing Hall mobility depending on fluorine concentration.

FIGS. 12 to 14 are graphs showing reliability depending on annealing temperature, and reliability was measured at annealing temperatures of 300° C. and 600° C.

Referring to FIGS. 12 to 14, it can be confirmed that, in the case of the plasma-treated source and drain regions of the oxide semiconductor layer, carrier concentration, resistivity, and Hall mobility do not change significantly at annealing temperatures of 300° C. and 600° C.

That is, when an oxide semiconductor layer is plasma-treated with a fluorine-based gas (e.g., NF$_3$ gas), even at an annealing temperature of 600° C., the physical properties or resistivity of the oxide semiconductor layer may be prevented from changing. Considering these results, the oxide semiconductor layer may be plasma-treated at a temperature of 600° C. or less, preferably 420° C. or less. In this case, the electrical properties and reliability of the oxide semiconductor layer may be improved.

In particular, referring to FIG. 12, it can be confirmed that, considering that change in the concentration of carriers in the source region or the drain region is insignificant even at high temperature from 300° C. to 600° C., the oxide semiconductor layer transistor according to an embodiment of the present invention exhibits improved stability according to temperature.

Figure 15:
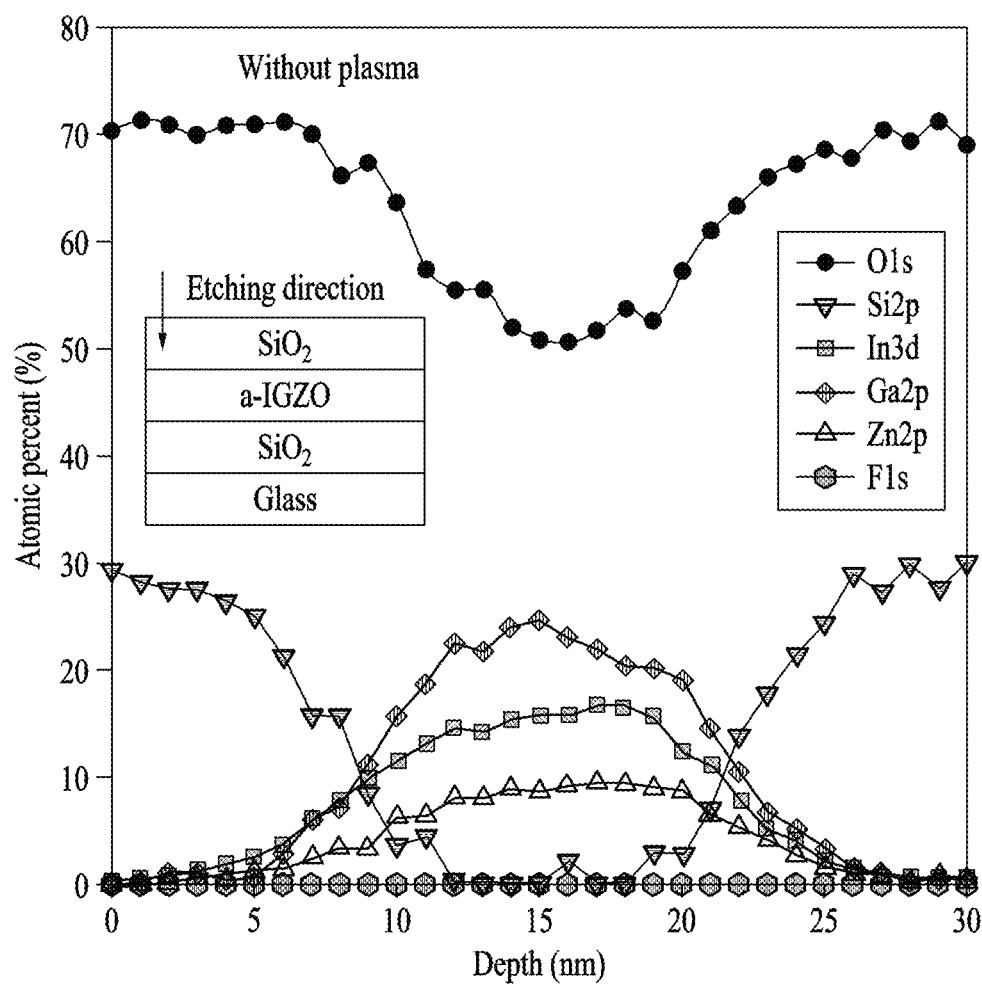
FIG. 15 is an X-ray photoelectron spectroscopy (XPS) graph showing atomic percent depending on the depth of an oxide semiconductor layer without plasma treatment.
Figure 16:
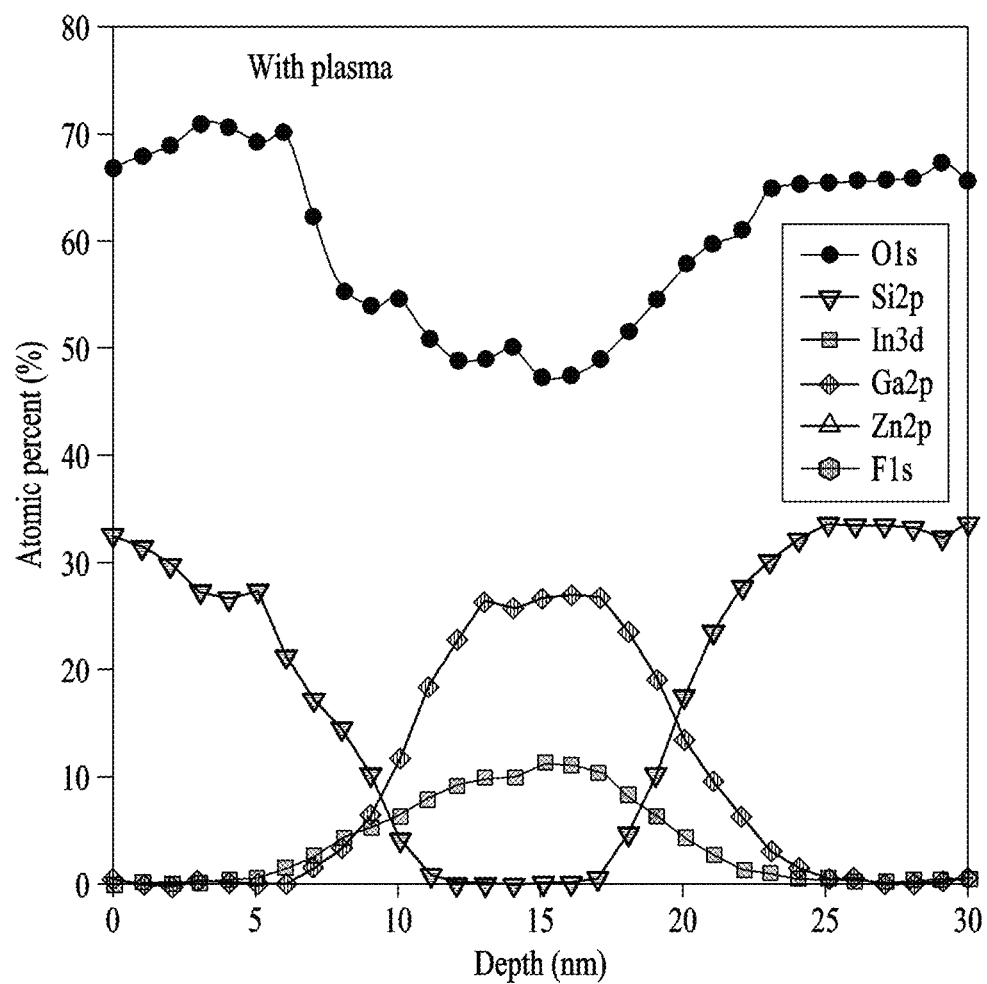
FIG. 16 is an X-ray photoelectron spectroscopy (XPS) graph showing atomic percent depending on the depth of an oxide semiconductor layer with plasma treatment.

FIG. 15 is an X-ray photoelectron spectroscopy (XPS) graph showing atomic percent depending on the depth of an oxide semiconductor layer without plasma treatment, and FIG. 16 is an X-ray photoelectron spectroscopy (XPS) graph showing atomic percent depending on the depth of an oxide semiconductor layer with plasma treatment.

Referring to FIG. 15, it can be confirmed that, in the case of the source and drain regions of the oxide semiconductor layer without plasma treatment, fluorine is not detected over ~30 nm depth.

Referring to FIG. 16, it can be confirmed that, in the case of the source and drain regions of the oxide semiconductor layer (a-IGZO) with plasma treatment, fluorine (F) is detected. Specifically, by plasma treatment using a fluorine-based gas (NF$_3$ gas), fluorine (F) with a concentration of 0.1% to 15% is detected from the surface of the oxide semiconductor layer having a depth of 30 nm to a region corresponding to a depth of about 13 nm.

Figure 17:
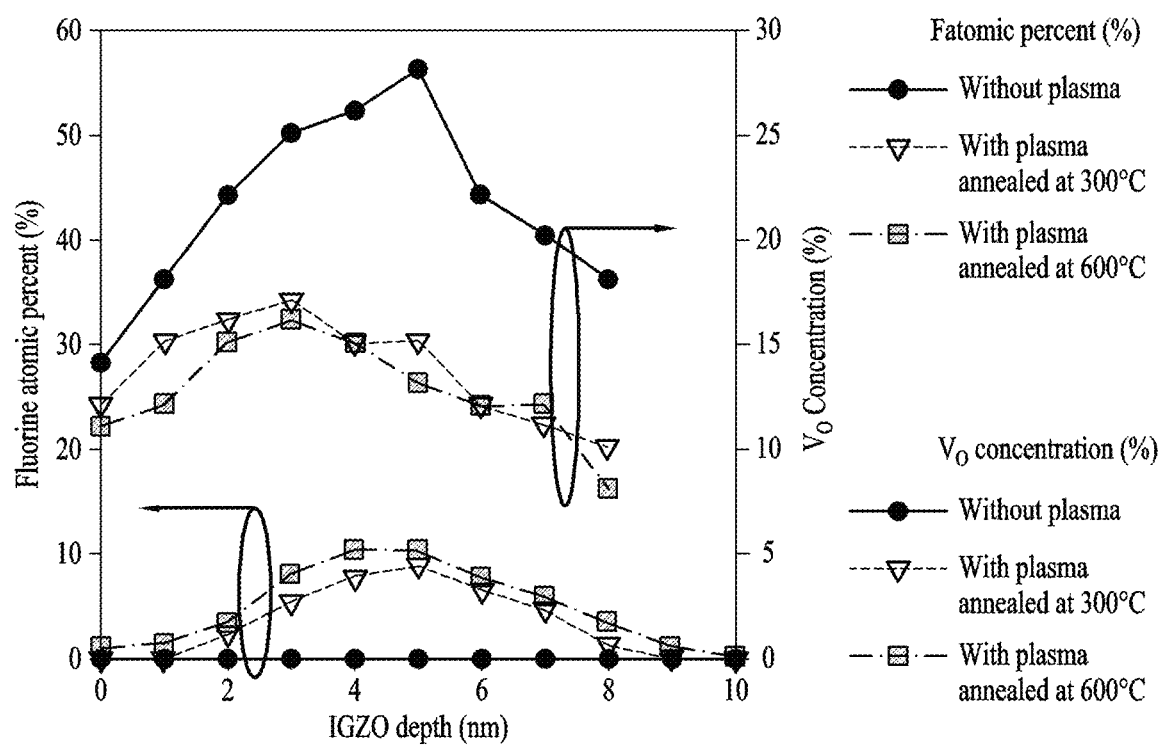
FIG. 17 is a graph showing the atomic percent of fluorine and the concentration of oxygen vacancies depending on the depth of a plasma-treated oxide semiconductor layer (IGZO depth) according to annealing temperature.

FIG. 17 is a graph showing the atomic percent of fluorine and the concentration of oxygen vacancies depending on the depth of a plasma-treated oxide semiconductor layer (IGZO depth) according to annealing temperature.

Referring to FIG. 17, it can be confirmed that, in the case of the plasma-treated oxide semiconductor layer, fluorine (F) with a concentration of 0.1% to 15% is detected from the surface of the oxide semiconductor layer to a region corresponding to a depth of about 9 nm. These results indicate that no significant change is observed at annealing temperatures of 300° C. and 600° C.

In addition, it can be confirmed that, in the case of the plasma-treated oxide semiconductor layer, oxygen vacancies with a concentration of 15% to 35% are detected from the surface of the oxide semiconductor layer to a region corresponding to a depth of about 8 nm. These results indicate that no significant change is observed at annealing temperatures of 300° C. and 600° C.

However, in the case of the oxide semiconductor layer that is not plasma-treated, oxygen vacancies with a concentration of 40% to 55% are detected from the surface of the oxide semiconductor layer to a region corresponding to a depth of about 8 nm. Based on these results, it can be seen that, in the case of the oxide semiconductor thin-film transistor according to an embodiment of the present invention, since the source and drain regions of the oxide semiconductor layer are plasma-treated with the fluorine-based gas, oxygen vacancies are reduced, thereby improving electrical properties and reliability.

FIGS. 18 to 21 are graphs showing log drain current and field effect mobility depending on the gate voltage of an oxide semiconductor thin-film transistor according to an embodiment of the present invention.

Here, the oxide semiconductor thin-film transistor is fabricated by the method described in FIG. 2, and the first and second offset regions have a width of 3 μm.

Figure 18:
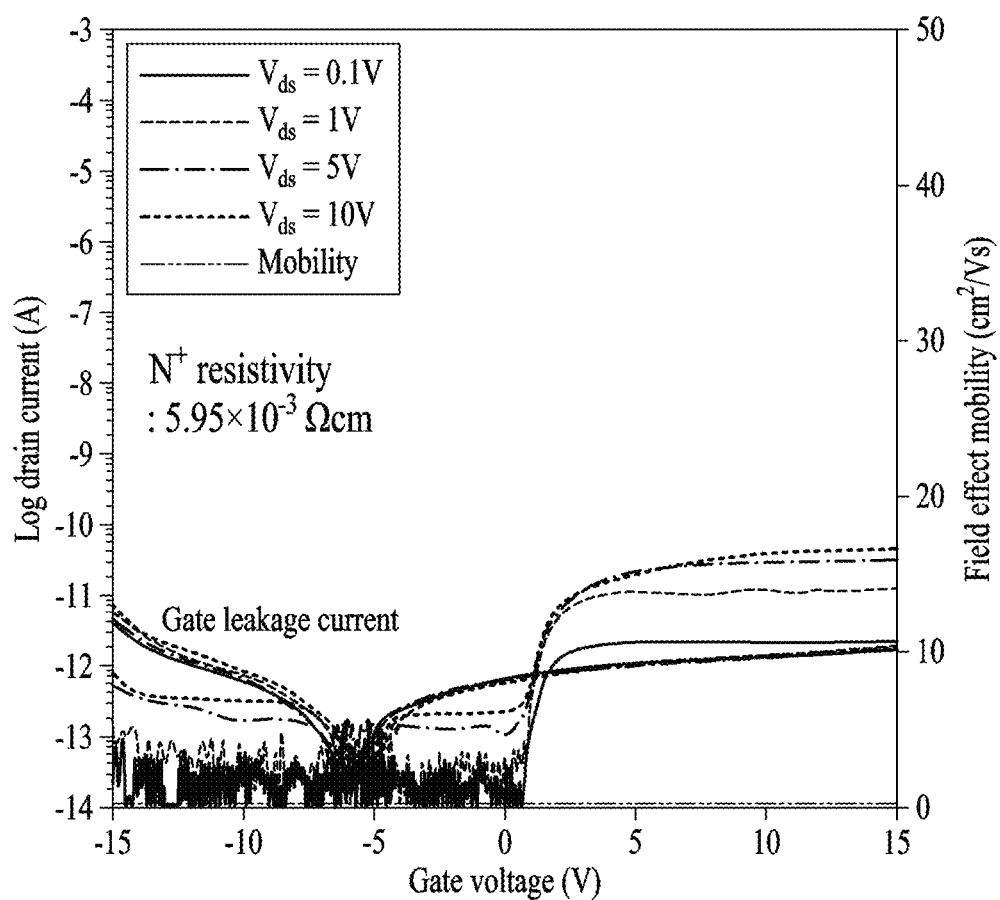
FIGS. 18 to 21 are graphs showing log drain current and field effect mobility depending on the gate voltage of an oxide semiconductor thin-film transistor according to an embodiment of the present invention.
Figure 19:
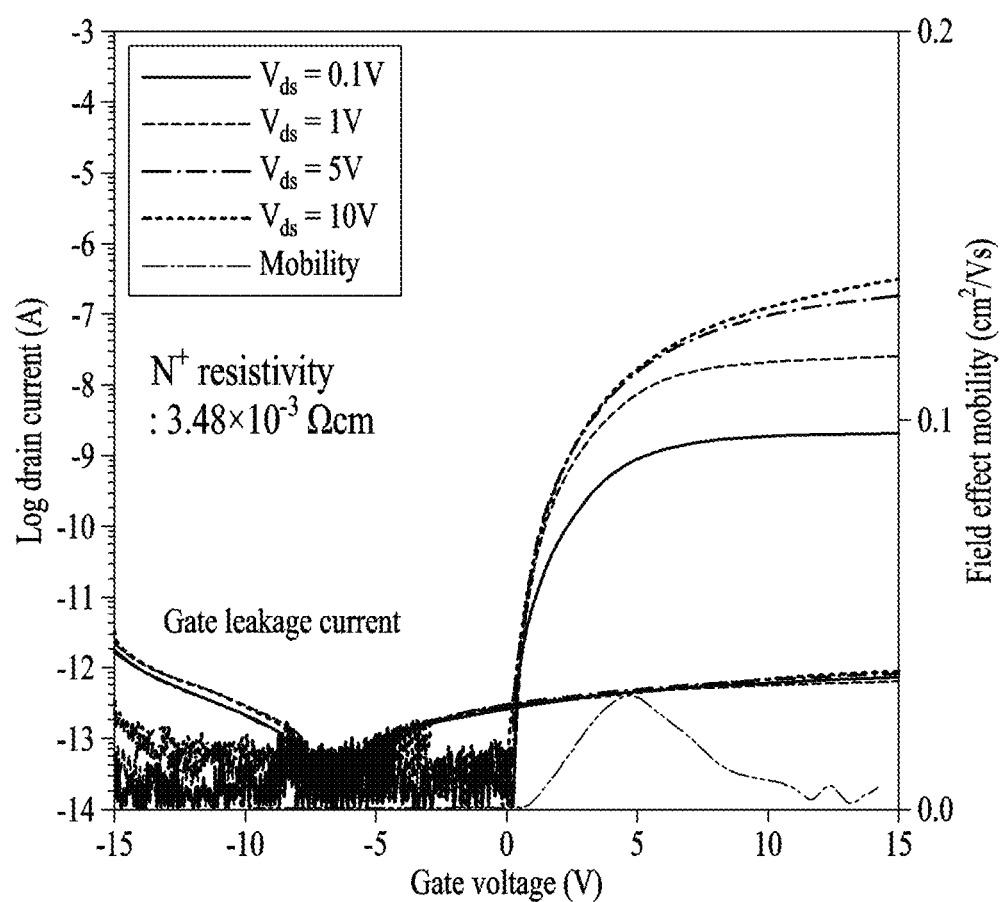
Figure 20:
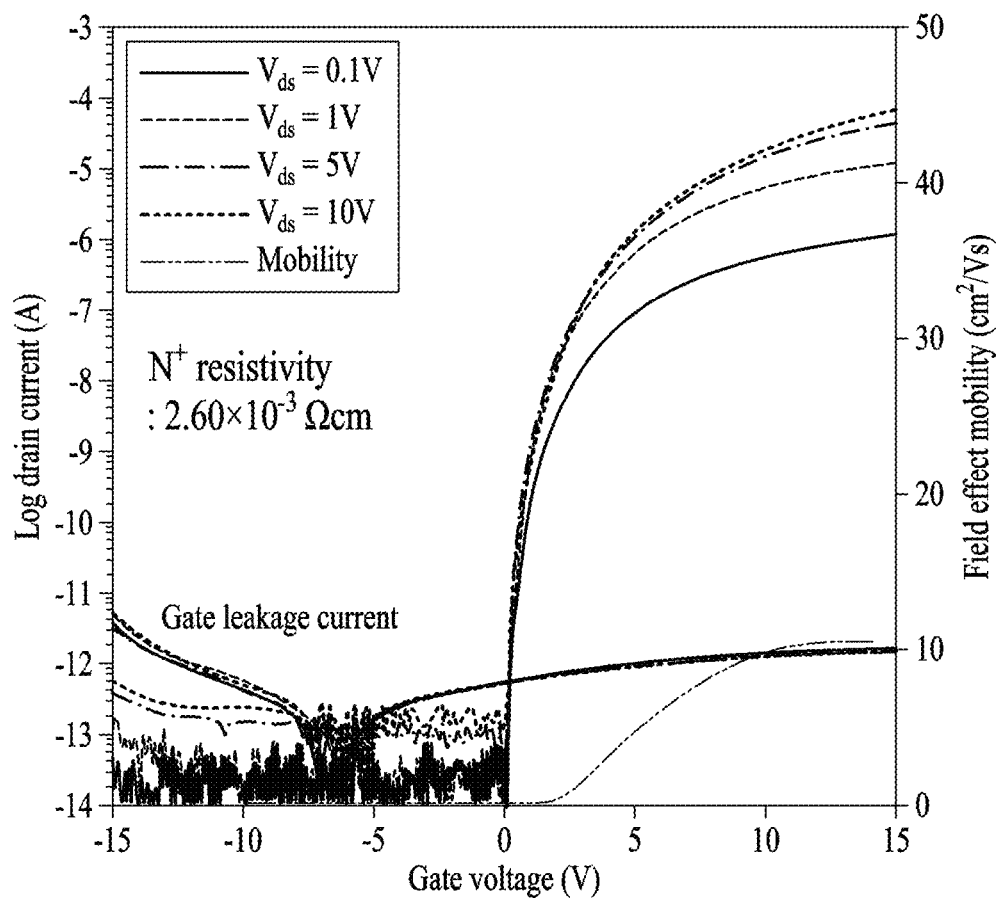
Figure 21:
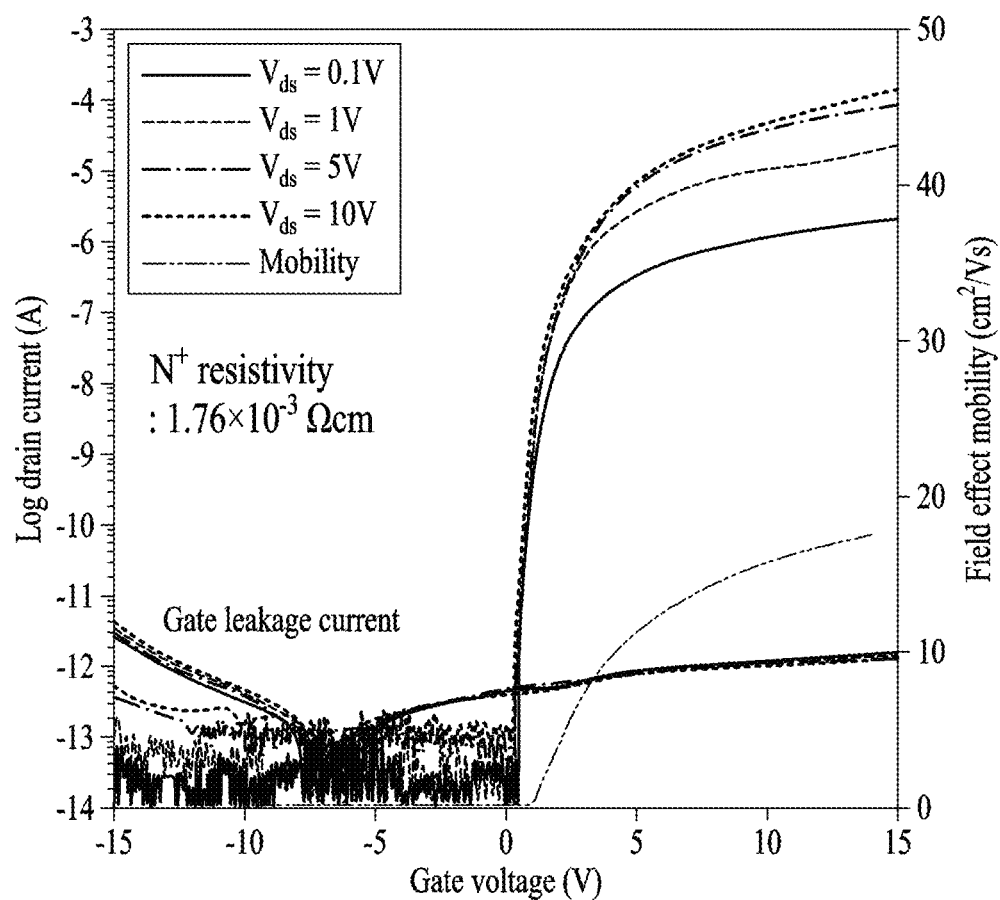

FIG. 18 shows transition properties when the resistivity of the plasma-treated oxide semiconductor layer is $5.95 \times 10^{-3}$ Ω·cm, FIG. 19 shows transition properties when the resistivity of the plasma-treated oxide semiconductor layer is $3.48 \times 10^{-3}$ Ω·cm, FIG. 20 shows transition properties when the resistivity of the plasma-treated oxide semiconductor layer is $2.60 \times 10^{-3}$ Ω·cm, and FIG. 21 shows transition properties when the resistivity of the plasma-treated oxide semiconductor layer is $1.76 \times 10^{-3}$ Ω·cm.

Referring to FIGS. 18 to 21, it can be confirmed that, in the case of the oxide semiconductor thin-film transistor according to an embodiment of the present invention, since the source and drain regions of the oxide semiconductor layer are plasma-treated with the fluorine-based gas, electrical properties are improved.

In particular, in the case of the oxide semiconductor thin-film transistor according to an embodiment of the present invention, the carrier concentration of a semiconductor may be controlled according to the concentration of fluorine. Thereby, resistivity may also be controlled. Accordingly, the electrical properties of the oxide semiconductor thin-film transistor including the source and drain regions having a very small amount of resistivity may be greatly changed. When resistivity is $5.95 \times 10^{-3}$ Ω·cm, due to large resistance, the oxide semiconductor thin-film transistor exhibits very weak on/off characteristics.

Accordingly, when the source and drain regions are plasma-treated with the fluorine-based gas, the properties of the oxide semiconductor thin-film transistor may be controlled according to resistivity values.

Figure 22:
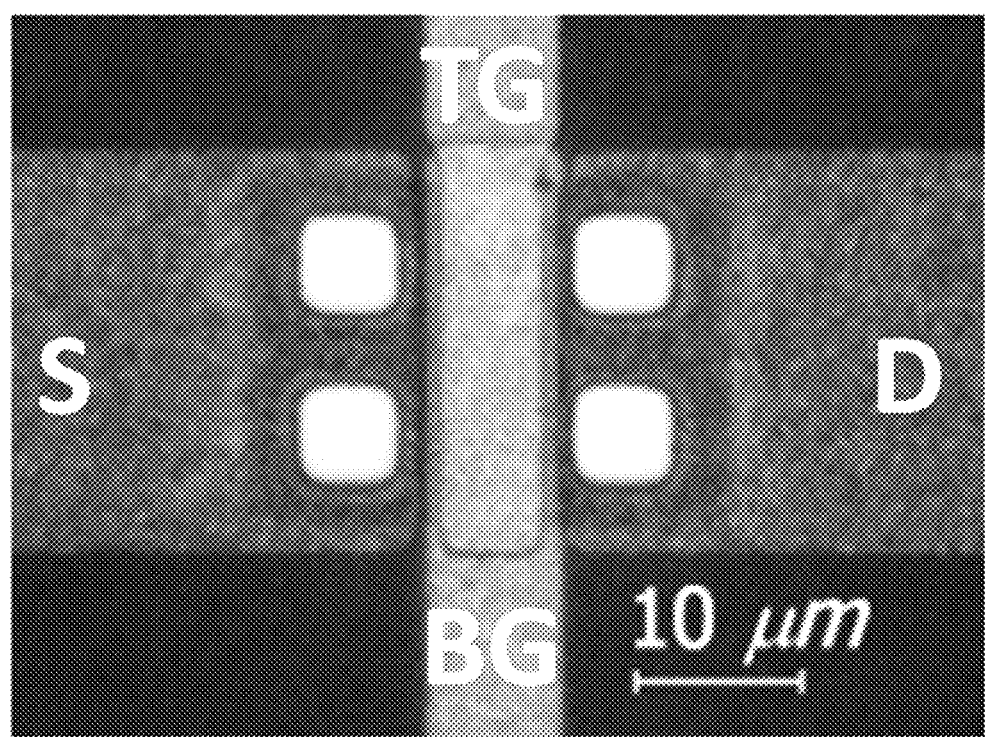
FIG. 22 is a scanning electron microscope image of a dual gate thin-film transistor not including plasma-treated first and second offset regions.
Figure 23:
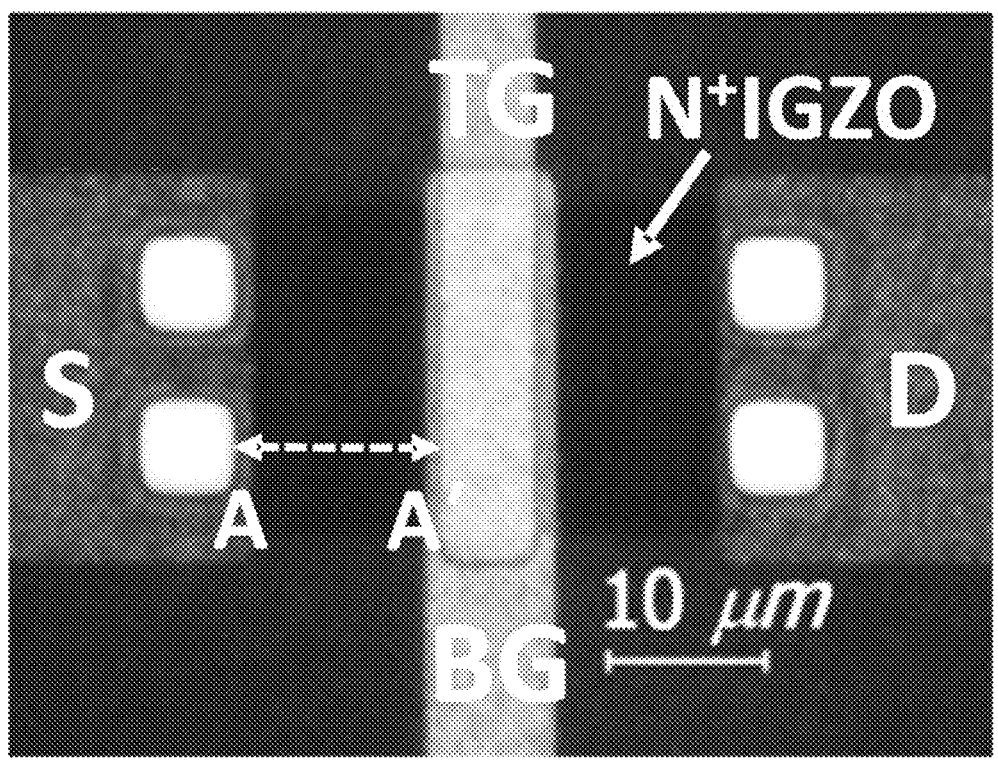
FIG. 23 is a scanning electron microscope image of a dual gate thin-film transistor including plasma-treated first and second offset regions according to an embodiment of the present invention.

FIG. 22 is a scanning electron microscope image of a dual gate thin-film transistor not including plasma-treated first and second offset regions, and FIG. 23 is a scanning electron microscope image of a dual gate thin-film transistor including plasma-treated first and second offset regions according to an embodiment of the present invention.

Referring to FIGS. 22 and 23, it can be confirmed that the conventional dual gate thin-film transistor does not include offset regions between the second gate electrode (TG) and the source/drain electrodes (S/D), but the dual gate thin-film transistor according to an embodiment of the present invention includes the first and second offset regions ($N^+$ IGZO) between the second gate electrode (TG) and the source/drain electrodes (S/D).

FIGS. 24 to 29 are graphs showing electrical properties depending on the lengths of first and second offset regions of a dual gate thin-film transistor according to an embodiment of the present invention.

Figure 24:
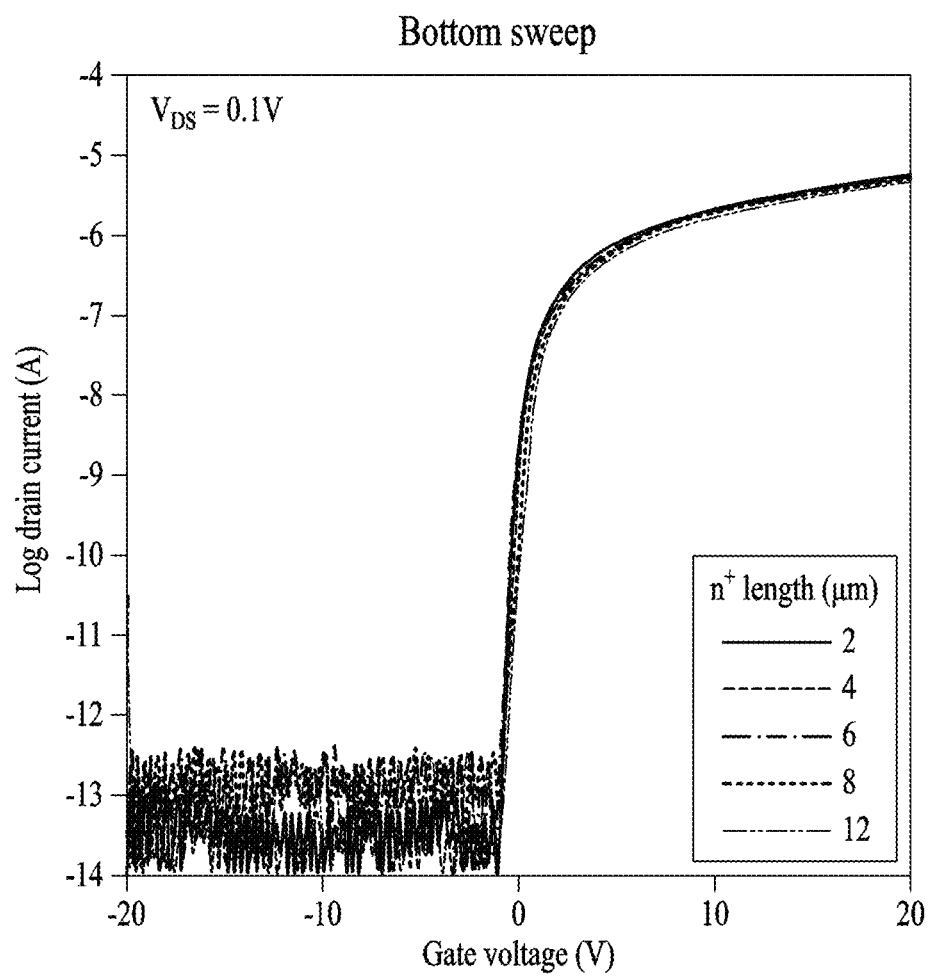
FIGS. 24 to 29 are graphs showing electrical properties depending on the lengths of first and second offset regions of a dual gate thin-film transistor according to an embodiment of the present invention.
Figure 25:
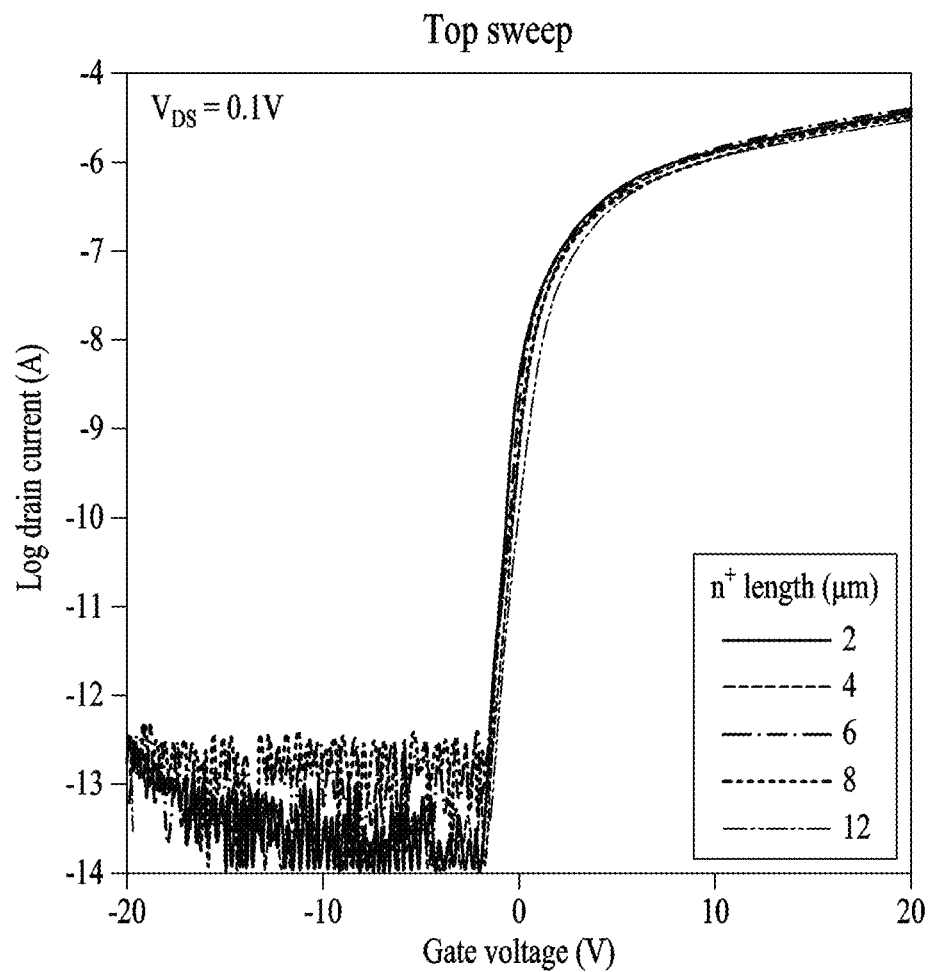
Figure 26:
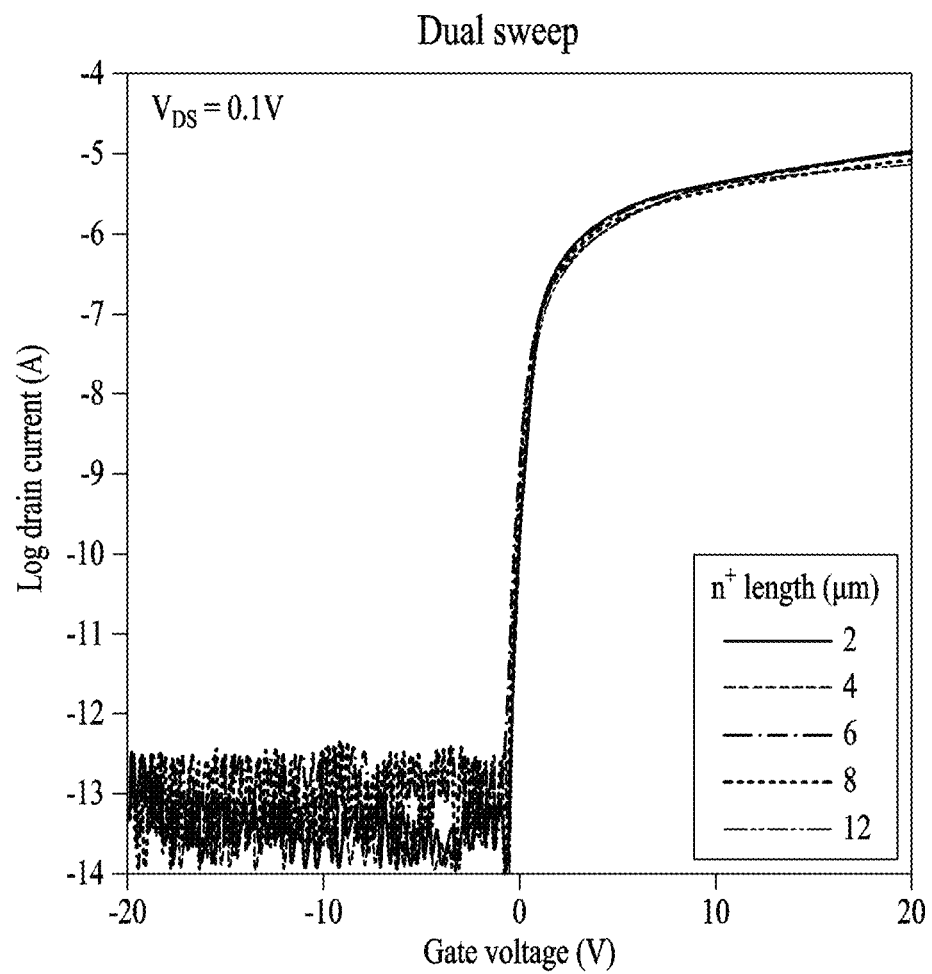
Figure 27:
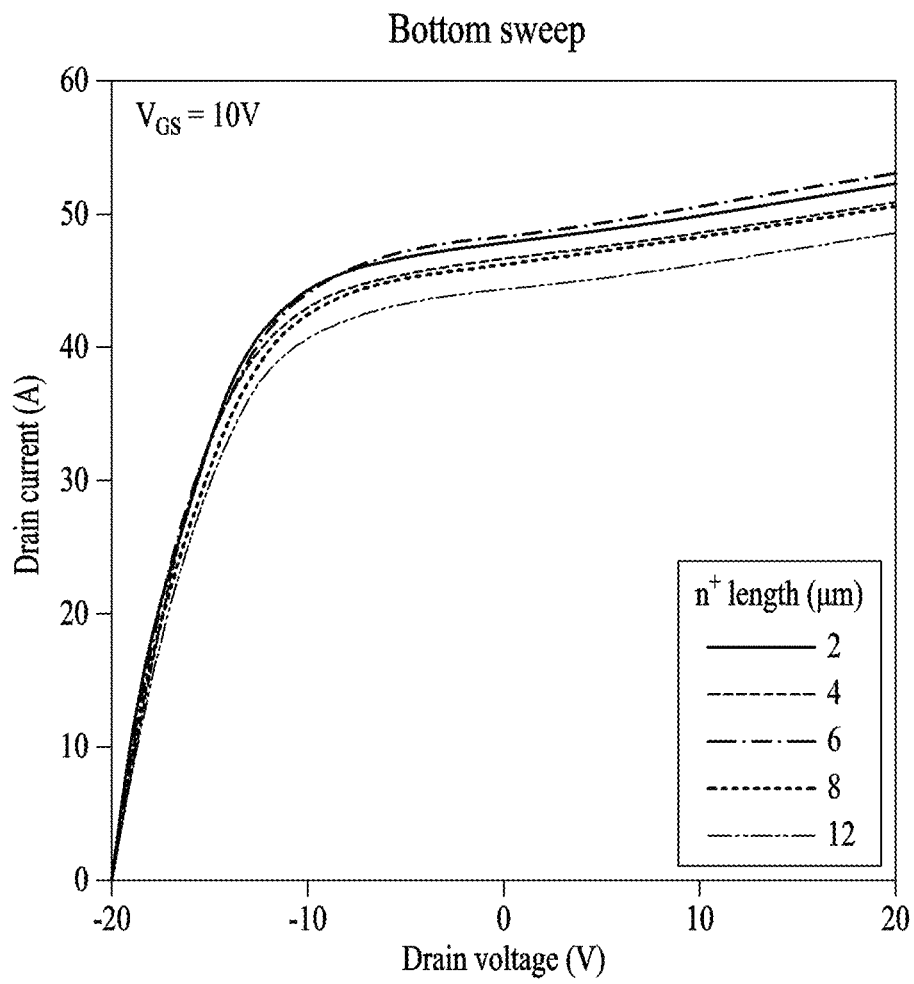
Figure 28:
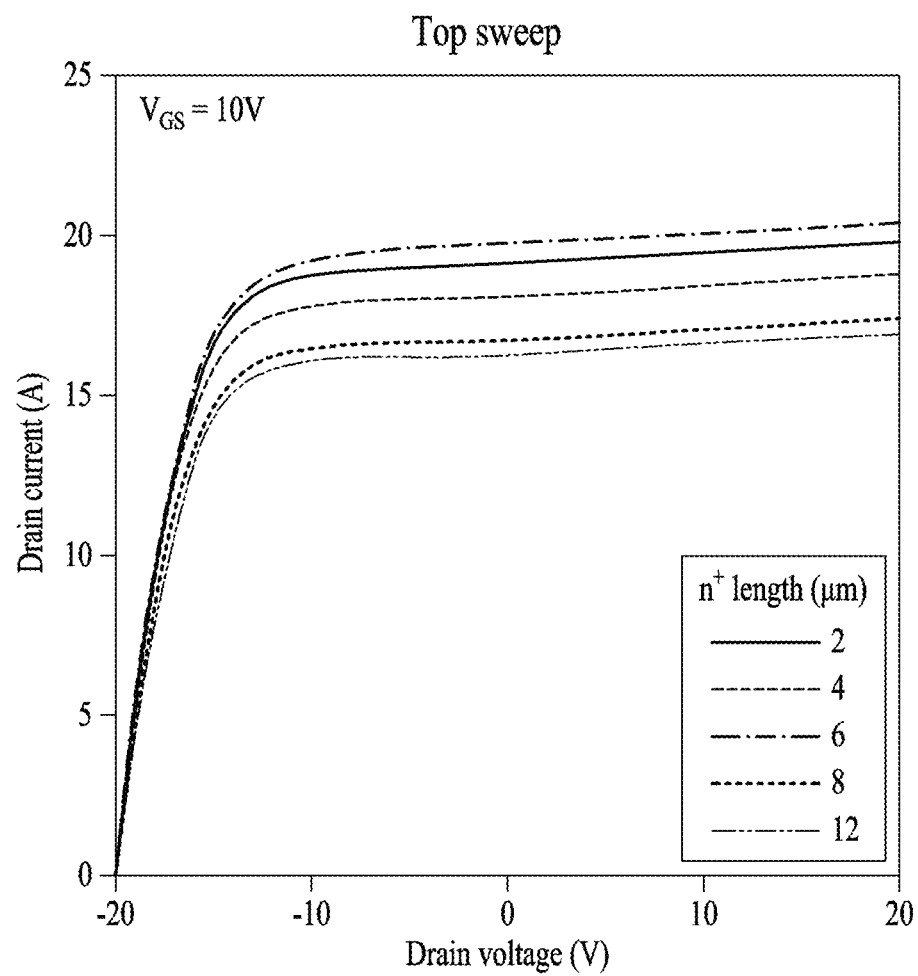
Figure 29:
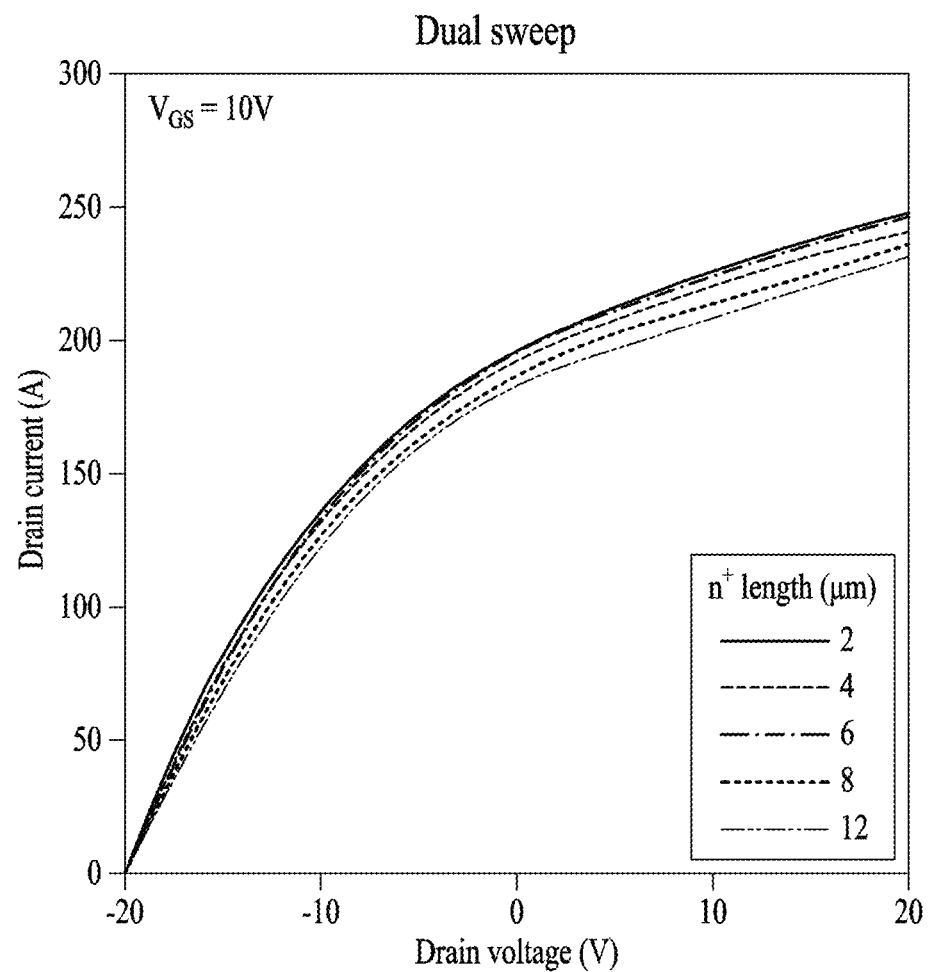

FIG. 24 shows log drain current according to gate voltage upon bottom sweep, FIG. 25 shows log drain current according to gate voltage upon top sweep, FIG. 26 shows log drain current according to gate voltage upon dual sweep, FIG. 27 shows drain current according to drain voltage upon bottom sweep, FIG. 28 shows drain current according to drain voltage upon top sweep, and FIG. 29 shows drain current according to drain voltage upon dual sweep.

Referring to FIGS. 24 to 29, it can be confirmed that bottom sweep is not affected by the lengths of the first and second offset regions.

In addition, it can be confirmed that the maximum value of current flowing through the drain electrode increases for dual sweep than for bottom sweep. In addition, it can be confirmed that, as the lengths of the first and second offset regions increase, the degree of increase in current decreases.

Figure 30:
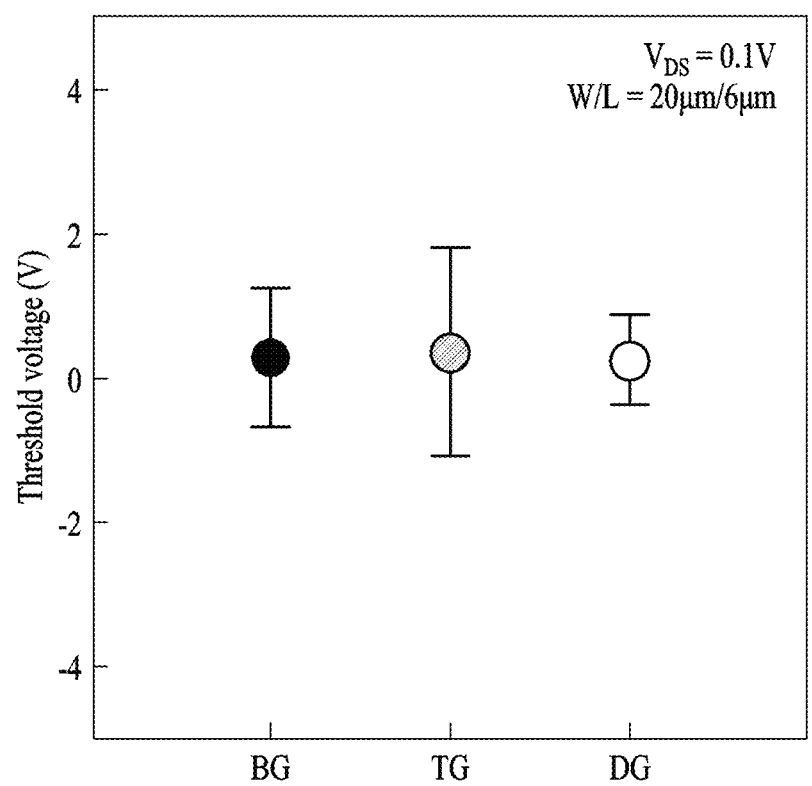
FIG. 30 is a graph showing the threshold voltages of an oxide semiconductor thin-film transistor according to an embodiment of the present invention (bottom gate (BG) and top gate (TG)) and a dual gate thin-film transistor according to an embodiment of the present invention (dual gate (DG))
Figure 31:
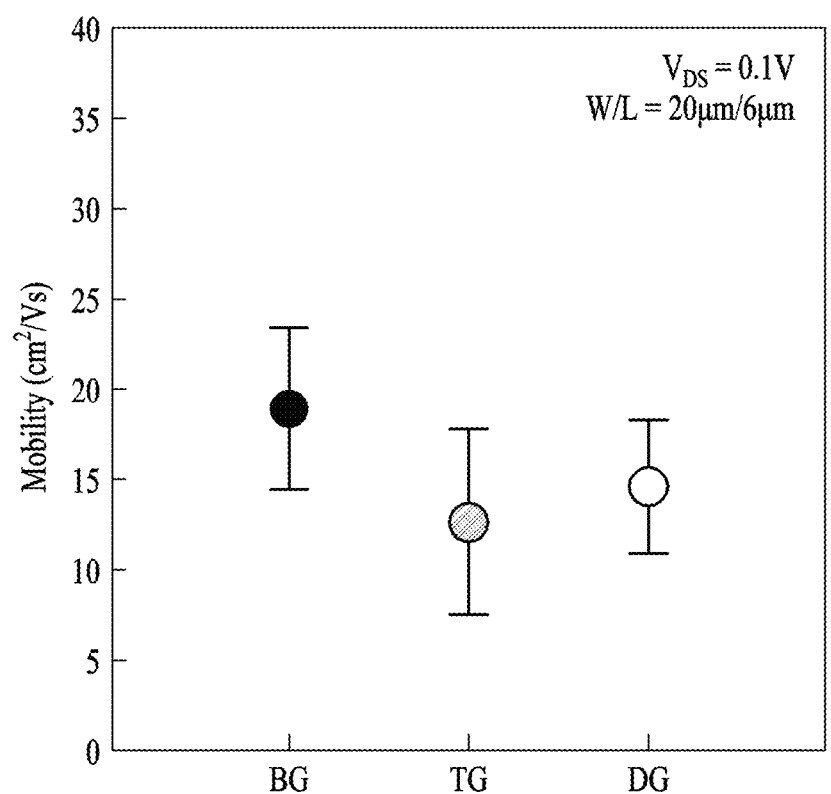
FIG. 31 is a graph showing the mobility of BG, TG, and DG.
Figure 32:
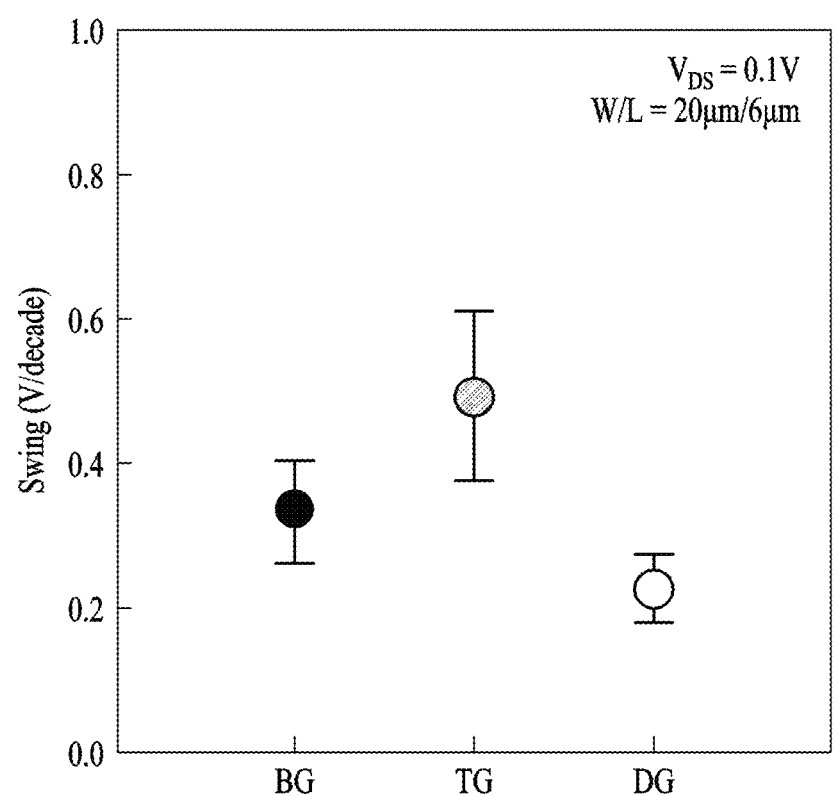
FIG. 32 is a graph showing the swing of BG, TG, and DG.
Figure 33:
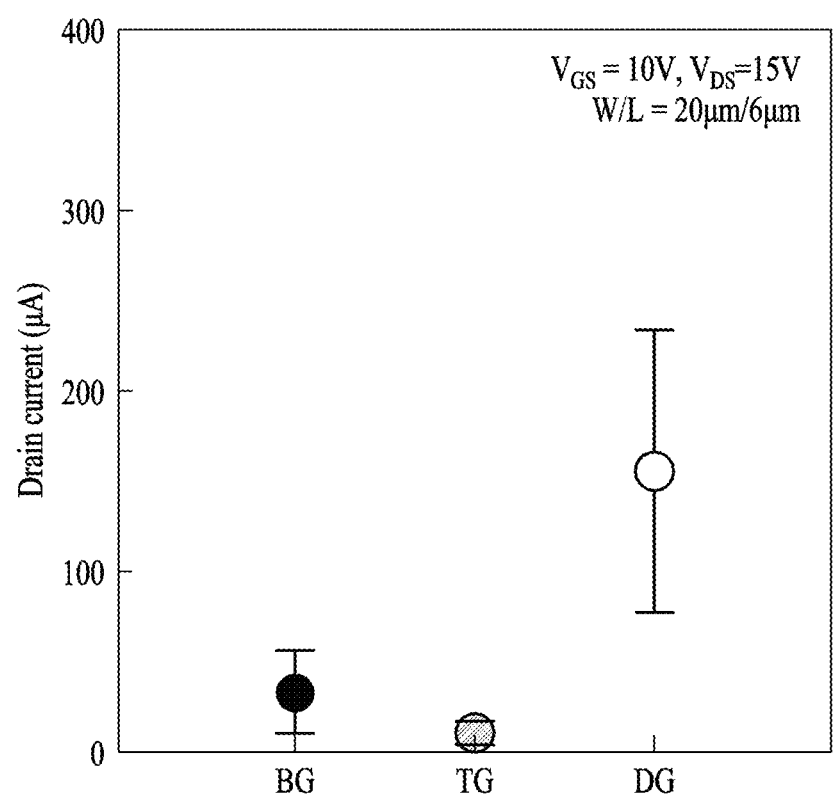
FIG. 33 is a graph showing the drain current of BG, TG, and DG.

FIG. 30 is a graph showing the threshold voltages of an oxide semiconductor thin-film transistor according to an embodiment of the present invention (bottom gate (BG) and top gate (TG)) and a dual gate thin-film transistor according to an embodiment of the present invention (dual gate (DG)), FIG. 31 is a graph showing the mobility of BG, TG, and DG, FIG. 32 is a graph showing the swing of BG, TG, and DG, and FIG. 33 is a graph showing the drain current of BG, TG, and DG.

Referring to FIGS. 30 to 33, it can be confirmed that, compared to the oxide semiconductor thin-film transistor according to an embodiment of the present invention (bottom gate (BG), top gate (TG)), the electrical properties of the dual gate thin-film transistor according to an embodiment of the present invention (dual gate (DG)) are further improved.

Figure 34:
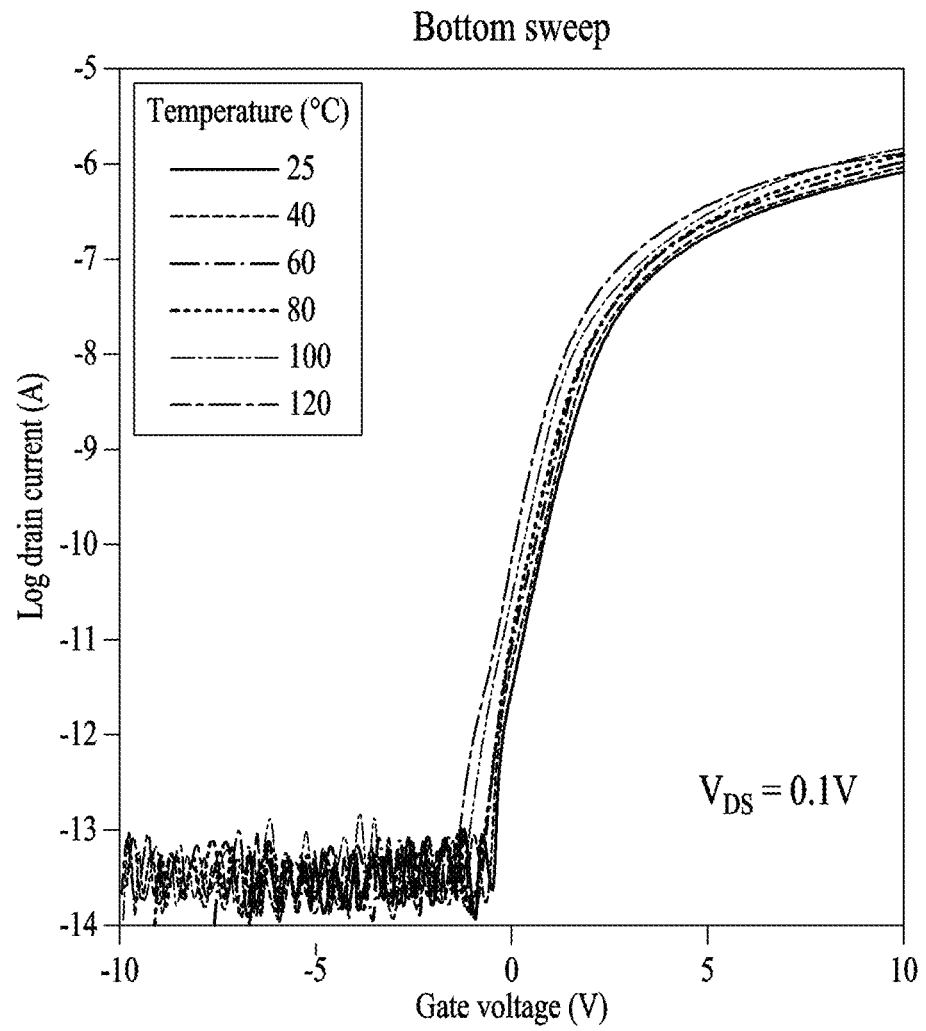
FIGS. 34 to 36 are graphs showing the stability of a dual gate thin-film transistor according to an embodiment of the present invention according to temperature.
Figure 35:
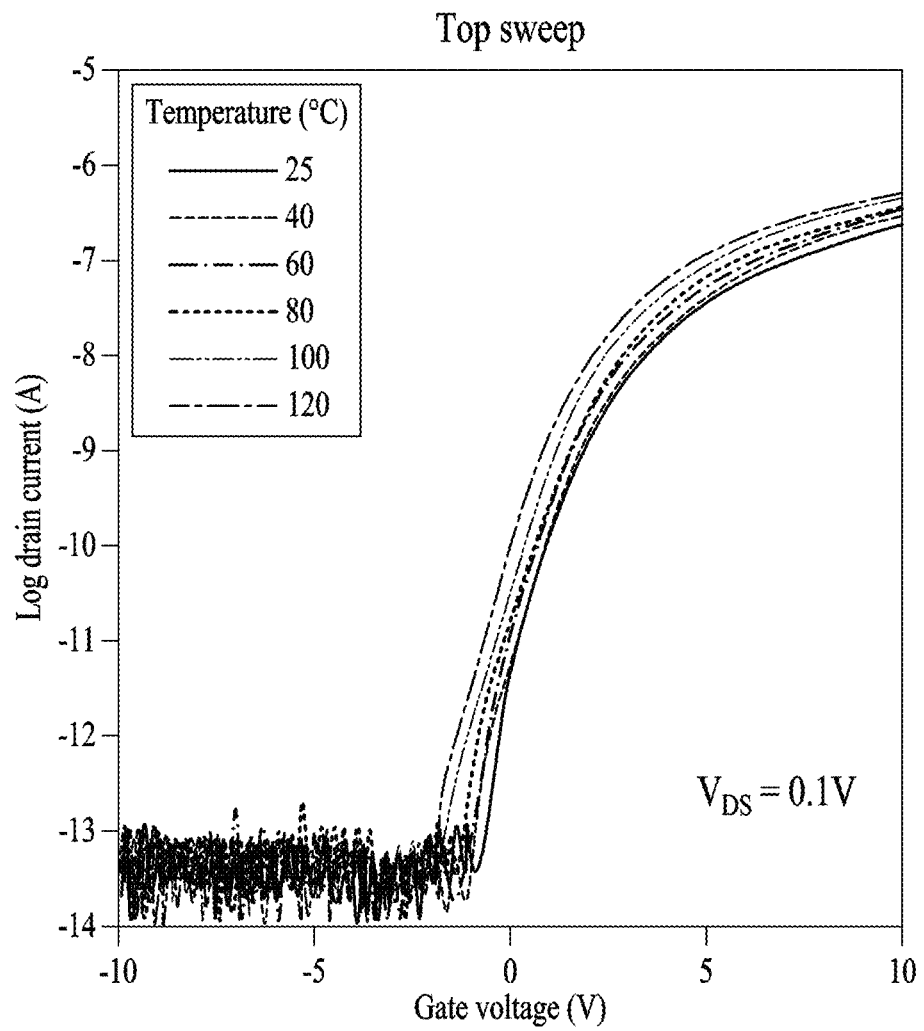
Figure 36:
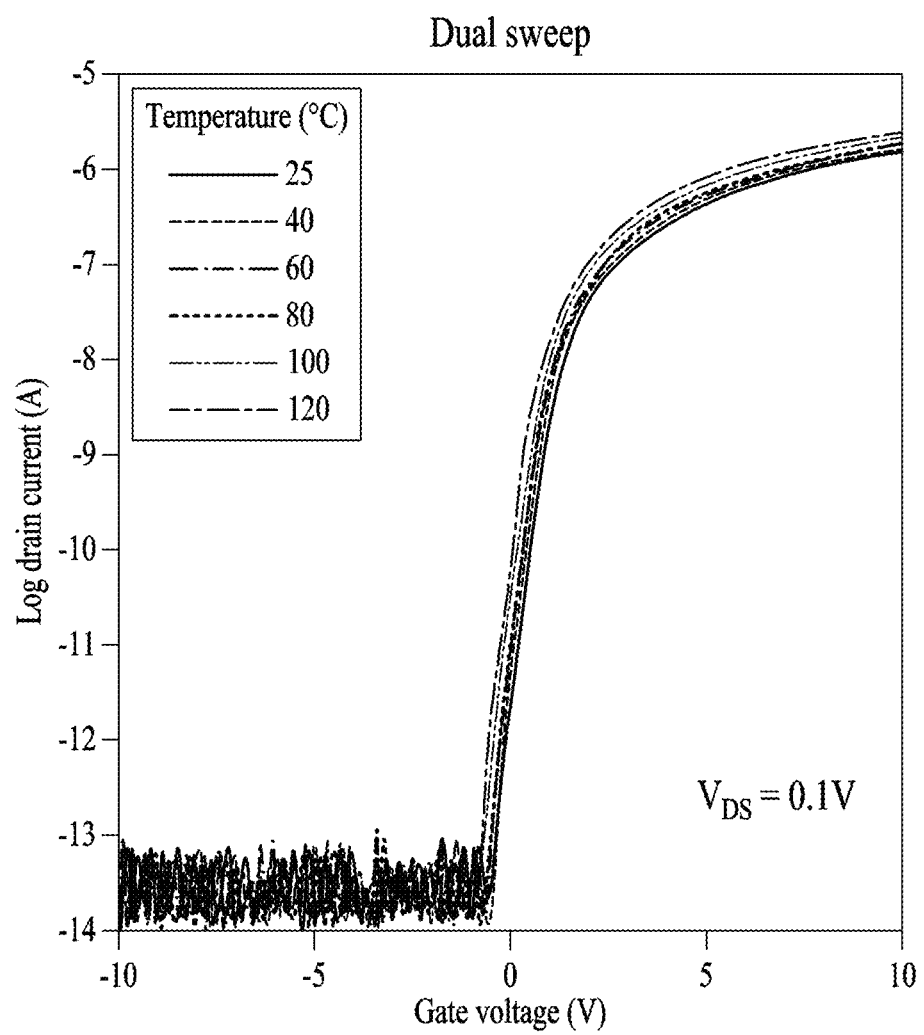

FIGS. 34 to 36 are graphs showing the stability of a dual gate thin-film transistor according to an embodiment of the present invention according to temperature.

FIG. 34 shows log drain current according to gate voltage upon bottom sweep, FIG. 35 shows log drain current according to gate voltage upon top sweep, and FIG. 36 shows log drain current according to gate voltage upon dual sweep.

Referring to FIGS. 34 to 36, since the dual gate thin-film transistor according to an embodiment of the present invention is plasma-treated with the fluorine-based gas, even when temperature changes from 25° C. to 120° C., electrical properties thereof are not changed. These results indicate that the stability of the dual gate thin-film transistor against temperature is improved.

Figure 37:
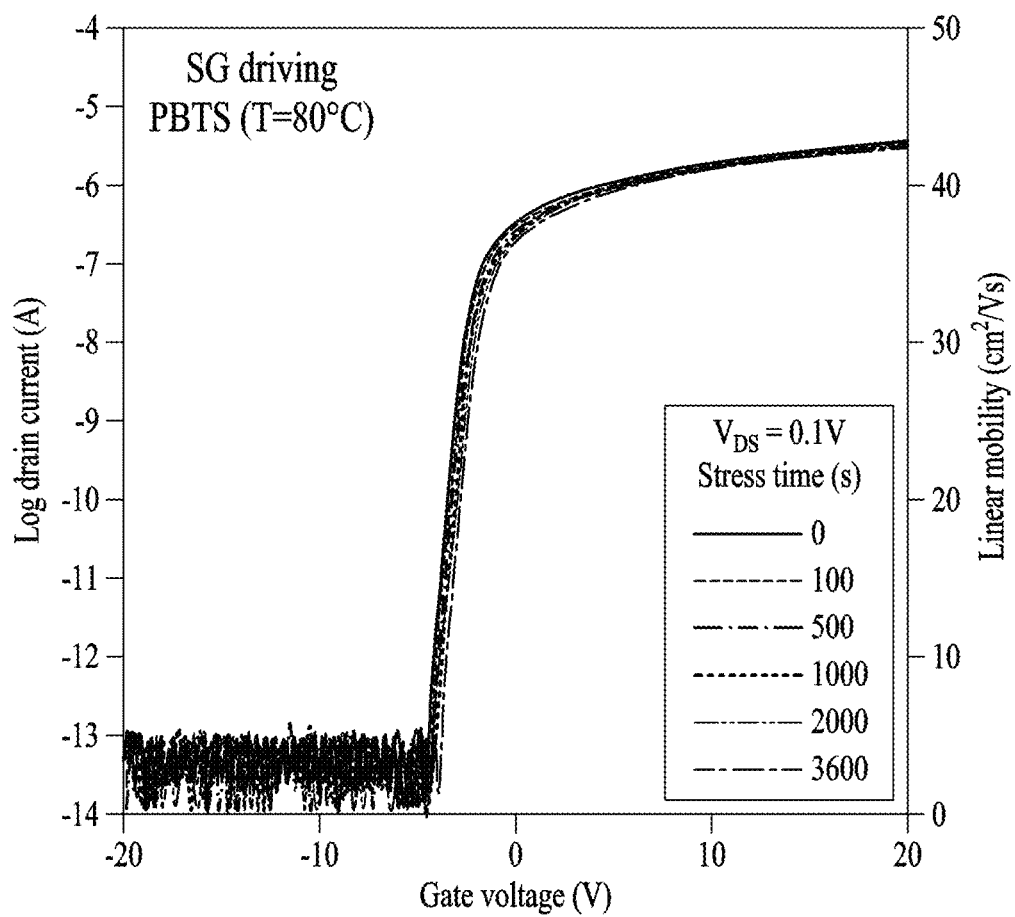
FIG. 37 is a graph showing the stability characteristics of an oxide semiconductor thin-film transistor according to an embodiment of the present invention according to temperature and bias.
Figure 38:
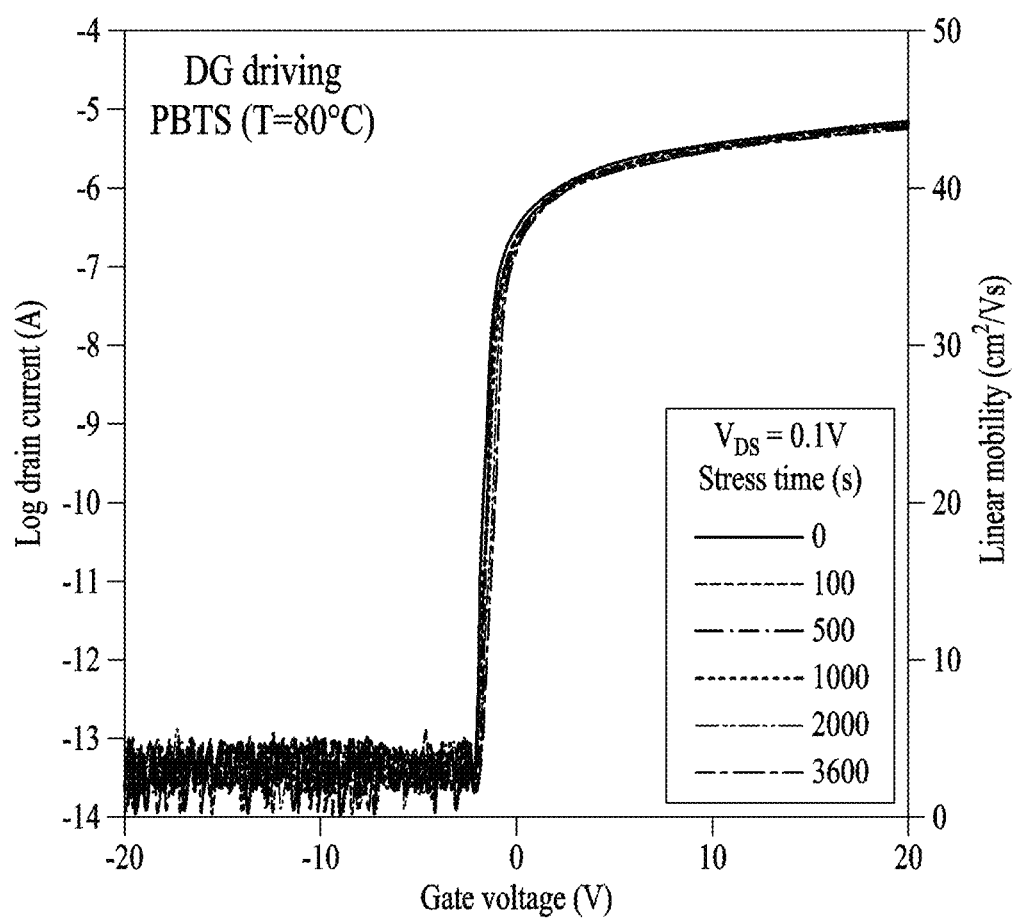
FIG. 38 is a graph showing the stability characteristics of a dual gate thin-film transistor according to an embodiment of the present invention according to temperature and bias.

FIG. 37 is a graph showing the stability characteristics of an oxide semiconductor thin-film transistor according to an embodiment of the present invention according to temperature and bias, and FIG. 38 is a graph showing the stability characteristics of a dual gate thin-film transistor according to an embodiment of the present invention according to temperature and bias.

FIGS. 37 and 38 show log drain current and linear mobility according to gate voltage.

Referring to FIGS. 37 and 38, in the case of both the oxide semiconductor thin-film transistor according to an embodiment of the present invention and the dual gate thin-film transistor according to an embodiment of the present invention, since the first and second offset regions are plasma-treated with the fluorine-based gas, electrical properties and stability against temperature are improved.

Although the present invention has been described through limited examples and figures, the present invention

| [Description of Symbols] | |
|---|---|
| 110, 210: SUBSTRATE | 121, 241: CHANNEL REGION |
| 122, 242: SOURCE REGION | 123, 243: DRAIN REGION |
| 130: GATE ELECTRODE | 140: GATE INSULATING LAYER |
| 151, 251: SOURCE ELECTRODE | 152, 252: DRAIN ELECTRODE |
| 160: BUFFER LAYER | 170, 260, 270: PROTECTIVE LAYER |
| 221: FIRST GATE ELECTRODE | 222: SECOND GATE ELECTRODE |
| 231: FIRST GATE INSULATING LAYER | 232: SECOND GATE INSULATING LAYER |

The invention claimed is:

1. A method of fabricating an oxide semiconductor thin-film transistor, comprising:
    a step of forming an oxide semiconductor layer having a thickness of 10 nm to 50 nm on a substrate, the oxide semiconductor layer comprising a channel region, a source region, and a drain region on a substrate;
    a step of forming a gate insulating layer on the channel region;
    a step of forming a gate electrode on the gate insulating layer; and
    a step of forming a source electrode and a drain electrode on the source and drain regions, respectively,
    wherein the step of forming an oxide semiconductor layer comprises a step of selectively plasma-treating the source and drain regions of the oxide semiconductor layer with a fluorine (F)-based gas, and
    the source and drain regions contain fluorine (F) at a concentration of $2\times10^{14}/cm^3$ to $17.5\times10^{21}/cm^3$,
    wherein the fluorine (F) is included in the source and drain regions of the oxide semiconductor layer at a concentration of 0.1% to 15%,
    wherein, when viewed in a direction perpendicular to the substrate, the oxide semiconductor layer comprises a first offset region and a second offset region formed between the gate electrode and the source electrode and between the gate electrode and the drain electrode, respectively,
    wherein the step of selectively plasma-treating the source and drain regions of the oxide semiconductor layer with the fluorine (F)-based gas comprises:
    a first plasma treatment step of selectively plasma-treating the source and drain regions of the oxide semiconductor layer with the fluorine (F)-based gas, and
    a second plasma treatment step of performing plasma treatment to decompose the fluorine-based gas in the first and second offset regions, and
    wherein the concentration of oxygen vacancies in the source and drain regions of the oxide semiconductor layer is in a range of 15% to 35%.

2. The method according to claim 1, wherein the fluorine-based gas diffuses on surfaces of the source and drain regions by plasma treatment.

3. The method according to claim 2, wherein the fluorine diffuses to a depth of 5 nm to 20 nm from surfaces of the source and drain regions of the oxide semiconductor layer.

4. The method according to claim 1, wherein the fluorine-based gas comprises at least one of carbon tetrafluoride ($CF_4$), nitrogen trifluoride ($NF_3$), and sulfur hexafluoride ($SF_6$).

5. The method according to claim 1, wherein the plasma treatment is performed at a temperature of 20° C. to 420° C.

6. The method according to claim 1, wherein the first and second offset regions each have a width of 0.5 µm or more.

7. The method according to claim 1, wherein the source and drain regions plasma-treated with the fluorine (F)-based gas have a resistivity of $1\times10^2$ Ω·cm to $3\times10^{-3}$ Ω·cm.

8. A method of fabricating a dual gate thin-film transistor, comprising:
    a step of forming a first gate electrode on a substrate;
    a step of forming a first gate insulating layer on the first gate electrode;
    a step of forming an oxide semiconductor layer having a thickness of 10 nm to 50 nm on a substrate, the oxide semiconductor layer comprising a channel region, a source region, and a drain region on the first gate insulating layer;
    a step of forming a second gate insulating layer on the channel region;
    a step of forming a second gate electrode on the second gate insulating layer; and
    a step of forming a source electrode and a drain electrode on the source and drain regions, respectively,
    wherein the step of forming an oxide semiconductor layer comprises a step of selectively plasma-treating the source and drain regions of the oxide semiconductor layer with a fluorine (F)-based gas, and
    the source and drain regions contain fluorine (F) at a concentration of $2\times10^{14}/cm^3$ to $17.5\times10^{21}/cm^3$,
    wherein the fluorine (F) is included in the source and drain regions of the oxide semiconductor layer at a concentration of 0.1% to 15%,
    wherein, when viewed in a direction perpendicular to the substrate, the oxide semiconductor layer comprises a first offset region and a second offset region formed between the second gate electrode and the source electrode and between the second gate electrode and the drain electrode, respectively,
    wherein the step of selectively plasma-treating the source and drain regions of the oxide semiconductor layer with the fluorine (F)-based gas comprises:
    a first plasma treatment step of selectively plasma-treating the source and drain regions of the oxide semiconductor layer with the fluorine (F)-based gas, and
    a second plasma treatment step of performing plasma treatment to decompose the fluorine-based gas in the first and second offset regions, and
    wherein concentration of oxygen vacancies in the source and drain regions of the oxide semiconductor layer is in a range of 15% to 35%.

9. The method according to claim 8, wherein the source and drain regions plasma-treated with the fluorine (F)-based gas have a resistivity of $1\times10^2$ Ω·cm to $3\times10^{-3}$ Ω·cm.

* * * * *